United States Patent
Natsume et al.

(10) Patent No.: US 7,244,982 B2
(45) Date of Patent: Jul. 17, 2007

(54) SEMICONDUCTOR DEVICE USING A CONDUCTIVE FILM AND METHOD OF MANUFACTURING THE SAME

(75) Inventors: Shinya Natsume, Osaka (JP); Shinichiro Hayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/487,969

(22) Filed: Jul. 18, 2006

(65) Prior Publication Data

US 2006/0267065 A1 Nov. 30, 2006

Related U.S. Application Data

(63) Continuation of application No. 10/885,707, filed on Jul. 8, 2004, now Pat. No. 7,091,541.

(30) Foreign Application Priority Data

| Jul. 8, 2003 | (JP) | ............................. 2003-271834 |
| Jul. 29, 2003 | (JP) | ............................. 2003-281443 |

(51) Int. Cl.
*H01L 27/108* (2006.01)
*H01L 29/76* (2006.01)
*H01L 29/94* (2006.01)
*H01L 31/119* (2006.01)

(52) U.S. Cl. ...................... 257/301; 257/296; 257/297; 257/298; 257/299; 257/300; 257/302; 257/303; 257/304; 257/305; 257/306; 257/307; 257/308; 257/309; 257/310; 257/311; 257/312; 257/313

(58) Field of Classification Search ......... 257/296–313
See application file for complete search history.

(56) References Cited

U.S. PATENT DOCUMENTS

| 6,091,099 A | 7/2000 | Kiyotoshi et al. |
| 6,365,420 B2 | 4/2002 | Ashida |
| 6,410,400 B1 | 6/2002 | Lee et al. |
| 6,576,942 B2 | 6/2003 | Okutoh et al. |
| 6,583,023 B2* | 6/2003 | Shimamoto et al. ........ 438/398 |
| 6,590,252 B2 | 7/2003 | Kutsunai et al. |
| 6,608,383 B2 | 8/2003 | Yokohama et al. |
| 6,617,691 B2 | 9/2003 | Nakajima et al. |
| 6,750,092 B2* | 6/2004 | Won et al. .................. 438/239 |
| 6,867,090 B2* | 3/2005 | Hiratani et al. ............. 438/243 |
| 6,940,112 B2 | 9/2005 | Rhodes et al. |

(Continued)

FOREIGN PATENT DOCUMENTS

CN 1295341 4/2006

(Continued)

*Primary Examiner*—Ida M. Soward
(74) *Attorney, Agent, or Firm*—McDermott Will & Emery LLP

(57) ABSTRACT

A semiconductor device has a capacitive element including a first conductive film formed on the bottom and wall surfaces of an opening formed in an insulating film on a substrate, a dielectric film formed on the first conductive film, and a second conductive film formed on the dielectric film. The dielectric film of the capacitive element is crystallized. The first and second conductive films are made of a polycrystal of an oxide, a nitride or an oxynitride of a noble metal.

2 Claims, 16 Drawing Sheets

U.S. PATENT DOCUMENTS

| | | |
|---|---|---|
| 6,955,959 B2 * | 10/2005 | Matsui et al. ............... 438/238 |
| 7,125,765 B2 * | 10/2006 | Yamamoto ................. 438/240 |
| 2001/0022369 A1 | 9/2001 | Fukuda et al. |
| 2002/0113237 A1 | 8/2002 | Kitamura |
| 2002/0190294 A1 | 12/2002 | Iizuka et al. |
| 2003/0011013 A1 * | 1/2003 | Joo et al. .................... 257/309 |
| 2003/0025142 A1 * | 2/2003 | Rhodes et al. .............. 257/301 |
| 2003/0041803 A1 * | 3/2003 | Kunitomo et al. .......... 118/715 |
| 2003/0047771 A1 * | 3/2003 | Kweon et al. .............. 257/306 |
| 2003/0062558 A1 | 4/2003 | Yang et al. |
| 2003/0104638 A1 * | 6/2003 | Kim et al. ..................... 438/3 |
| 2003/0183936 A1 | 10/2003 | Ito et al. |
| 2003/0190808 A1 | 10/2003 | Kim et al. |
| 2004/0005724 A1 | 1/2004 | Lee et al. |
| 2004/0018678 A1 * | 1/2004 | Chung et al. ............... 438/239 |
| 2004/0175586 A1 * | 9/2004 | Raaijmakers et al. ....... 428/469 |
| 2004/0212000 A1 | 10/2004 | Matsui et al. |
| 2005/0020060 A1 * | 1/2005 | Aaltonen et al. ........... 438/650 |
| 2005/0244988 A1 | 11/2005 | Wang et al. |

FOREIGN PATENT DOCUMENTS

| | | |
|---|---|---|
| JP | 2001-160616 A | 6/2001 |
| JP | 2001-223345 A | 8/2001 |
| JP | 2002-76306 | 3/2002 |
| JP | 2002-231905 A | 8/2002 |
| KR | 2001-0110527 A | 12/2001 |

* cited by examiner

SEMICONDUCTOR DEVICE USING A CONDUCTIVE FILM AND METHOD OF MANUFACTURING THE SAME

RELATED APPLICATIONS

This application is a continuation of U.S. patent application Ser. No. 10/885,707 filed Jul. 8, 2004, now U.S. Pat. No. 7,091,541 which is based on Japanese Patent Application Nos. JP 2003-281443, filed Jul. 29, 2003, and JP 2003-271834, filed Jul. 8, 2003, the contents of which are hereby incorporated by reference.

BACKGROUND OF THE INVENTION (1) Field of the Invention

The present invention relates to a semiconductor device having a so-called three-dimensional capacitor, and more particularly relates to a semiconductor device using a noble metal for a conductive film constituting an electrode of the three-dimensional capacitor and a method for fabricating the same.

(2) Description of Related Art

Capacitor insulating films made of a high-dielectric-constant material or a ferroelectric material of a perovskite crystal structure are used for semiconductor memory devices such as dynamic random access memories (DRAM) and ferroelectric random access memories (FeRAM), and need to be subjected to heat treatment at a relatively high temperature in an oxygen atmosphere in order to provide crystallization and improve their quality. If, during this heat treatment, the composition of a capacitor insulating film is shifted from its design value, for example, because of a reaction between the capacitor insulating film and an electrode material, this causes deterioration in characteristics such as a decrease in the polarization of the capacitor insulating film and an increase in leakage current. To cope with this problem, platinum (Pt) or ruthenium (Ru) both with extremely poor chemical reactivity is generally used for a conductive film material which forms a lower electrode or an upper electrode to contact such a capacitor insulating film. This provides resistance to oxidation and can prevent the composition of the capacitor insulating film from being shifted.

With the increasing miniaturization and integration of semiconductor integrated circuits, memory cells of DRAM devices and FeRAM devices have also been demanded to be finer. As a result, capacitive elements constituting memory cells are being formed in three-dimensional shapes to increase their capacitances per unit area.

For example, Japanese Unexamined Patent Publication No. 2001-160616 (hereinafter, referred to as Document 1) discloses an example in which a lower electrode containing platinum or iridium is formed along the top of an underlying substrate of an uneven shape in cross section by metal organic chemical vapor deposition (MOCVD) and then a dielectric film and an upper electrode are successively formed on the formed lower electrode, thereby forming a capacitor. With this method, the lower electrode can be formed, even on a large-aspect-ratio groove (concave part), to have a good coverage and a uniform thickness.

Japanese Unexamined Patent Publication No. 2002-231905 (hereinafter, referred to as Document 2) discloses an example of a capacitive element including a high-dielectric-constant film or a ferroelectric film of a three-dimensional shape, for example, a concave shape. In this example, a lower conductive film is formed along a recess by sputtering and then an upper conductive film is formed by CVD on the formed lower conductive film. Thus, an electrode film consisting of the lower conductive film and the upper conductive film is formed to prevent the electrode film from being disconnected at the bottom corners of the formed electrode film. In this way, the use of sputtering improves the lower conductive film in its morphology, and the later use of CVD provides a uniform thickness of the upper conductive film. Hence, the lower and upper conductive films are difficult to agglomerate even during heat treatment for crystallizing the dielectric film. As a result, the electrode film can be prevented from being disconnected at its bottom corners.

Japanese Unexamined Patent Publication No. 2001-223345 (hereinafter, referred to as Document 3) discloses an example in which a glue layer is formed on the sidewalls of a lower electrode of a concave cross section, thereby preventing the lower electrode from peeling off during heat treatment for crystallizing a dielectric film. In this case, the glue layer consists of an oxide using any one of titanium (Ti), tantalum (Ta), tungsten (W), and copper (Cu) or a mixture of such an oxide and another metal. Document 3 also discloses that a compound consisting of barium strontium ruthenium oxide ((Ba, Sr)RuO$_3$) or an amorphous material containing ruthenium (Ru) or oxygen (O) is used for the glue layer. Furthermore, the bottom electrode is composed of ruthenium (Ru), ruthenium oxide (RuO$_2$) or a mixture of them.

Japanese Unexamined Patent Publication No. 2002-76306 (hereinafter, referred to as Document 4) discloses an example in which a glue layer of tantalum nitride (TaN) is formed between a metallic film of a platinum group constituting a bottom electrode of a capacitive element and an insulating film of silicon oxide, thereby preventing the metal film from peeling off at the interface with the insulating film. Furthermore, in this case, the upper end of the glue layer is removed, and then covered with the bottom electrode, thereby preventing the glue layer from being oxidized.

SUMMARY OF THE INVENTION

The present inventors found various problems that occur when a ferroelectric nonvolatile memory (FeRAM) device with a capacitor of a concave structure is fabricated by a known method. These problems will be described below.

When a platinum (Pt) film that is a metallic film is used for a lower electrode or an upper electrode of a capacitor, high-temperature heat treatment in an oxygen atmosphere for the later crystallization of a ferroelectric film causes the migration and volume shrinkage of the platinum film and further causes the disconnection thereof. Such disconnection of the electrode film decreases the electrode area and thus reduces the capacitance of the capacitor. Furthermore, a stress during migration degrades the quality of the ferroelectric film, resulting in deterioration in characteristics, such as leakage current.

The disconnection of the platinum film causes a film other than the platinum film with excellent chemical stability to contact the ferroelectric film, or causes the components of the film other than the platinum film to diffuse into the ferroelectric film or conversely causes the components of the ferroelectric film to diffuse into the film other than the platinum film. As a result, the quality of the ferroelectric film varies, leading to a decrease in polarization due to a change in the composition of the dielectric film or an increase in leakage current.

Furthermore, the crystal of the dielectric film is grown and orientated in accordance with the crystallinity of the platinum film serving as an underlying film. Therefore, if disconnection is caused in the underlying platinum film, this may also cause that a part of the dielectric film located on a disconnected part of the platinum film has a different crystallinity from the other part of the dielectric film.

The present invention is made to solve the above problems, and its object is to prevent a conductive film placed in the vicinity of a dielectric from being disconnected even when the dielectric is subjected to heat treatment at a relatively high temperature.

In order to accomplish the above object, a first semiconductor device of the present invention comprises a capacitive element including a first conductive film formed on the bottom and wall surfaces of an opening formed in an insulating film on a substrate, a dielectric film formed on the first conductive film, and a second conductive film formed on the dielectric film, wherein the dielectric film of the capacitive element is crystallized, and each of the first and second conductive films is made of a polycrystal of an oxide, a nitride or an oxynitride of a noble metal.

According to the first semiconductor device, the conductive film can be prevented from being disconnected due to the heat treatment for the crystallization of the dielectric film. The reason for this is that a conductive film made of an oxide, a nitride or an oxynitride of a noble metal has a higher resistance to migration and a smaller volume shrinkage than that consisting of only the noble metal. Furthermore, atoms constituting the dielectric film can be prevented from being diffused during the heat treatment on the dielectric film, because a film of an oxide, a nitride or an oxynitride of a noble metal is generally chemically stable. This can suppress a decrease in the polarization of the dielectric. Therefore, the reliability of the dielectric can be maintained to realize a stable electrode.

In the first semiconductor device, the size of grains constituting the polycrystal of at least one of the first and second conductive films is preferably one-third or less of the thickness of the conductive film. This improves the resistance of the conductive film to migration. Therefore, the conductive film can certainly be prevented from being disconnected.

In the first semiconductor device, at least one of the first and second conductive films preferably includes a refractory metal. The addition of a refractory metal to the conductive film in this way prevents the conductive film from being disconnected due to the heat treatment on the dielectric film. This reason for this is that such a conductive film has a higher resistance to migration and a smaller volume shrinkage than that containing no refractory metal. This can prevent the conductive film from being disconnected during the heat treatment on the dielectric film.

In this case, the refractory metal is preferably made of a metal different from a noble metal constituting the conductive film.

A second semiconductor device of the present invention comprises: a first conductive film formed in the form of an island on an insulating film on a substrate or formed on an insulating film of an uneven shape and along its uneven shape; a dielectric film formed on the first conductive film; and a second conductive film formed on the dielectric film, wherein the first and second conductive films are made of an oxide, a nitride or an oxynitride of a noble metal, and at least one of the first and second conductive films contains a refractory metal.

According to the second semiconductor device, the conductive film to which the refractory metal is added has a higher resistance to migration and a smaller volume shrinkage than that containing no refractory metal. This can prevent the conductive film from being disconnected during the heat treatment on the dielectric film.

It is preferable that each of the first and second semiconductor devices further comprises an adhesion layer for enhancing the adhesion of the first conductive film to the insulating film between the insulating film and the first conductive film. This further improves the resistance of the first conductive film to migration.

In this case, the adhesion layer is preferably made of a conductive material hardly oxidized by a process for improving the quality of the dielectric film. This can prevent the adhesion layer from peeling off due to its oxidation, even when the heat treatment for improving the quality of the dielectric film is performed after the formation of the adhesion layer.

In the first or second semiconductor device, the percentage of the refractory metal present in the first or second conductive film is preferably 0.5 weight % through 30 weight % both inclusive. In this case, the refractory metal preferably is made of a metal different from the noble metal constituting the conductive film.

In the first or second semiconductor device, the noble metal preferably includes iridium as its main ingredient.

In the first or second semiconductor device, the dielectric film is preferably a ferroelectric film of a perovskite oxide.

In this case, the ferroelectric film preferably includes bismuth as its main ingredient.

A first method for fabricating a semiconductor device of the present invention comprises the steps of: (a) forming an opening in an insulating film on a substrate and thereafter forming a first conductive film of an oxide, a nitride or an oxynitride of a noble metal on the bottom and wall surfaces of the formed opening; (b) forming a dielectric film on the first conductive film; (c) forming a second conductive film of an oxide, a nitride or an oxynitride of a noble metal on the dielectric film; and (d) crystallizing the formed dielectric film after the step (c), wherein in the steps (a) and (c), the first and second conductive films each have a polycrystalline structure.

According to the first method for fabricating a semiconductor device, the conductive film can be prevented from being disconnected due to the heat treatment for the crystallization of the dielectric film. The reason for this is that an oxide, a nitride or an oxynitride of a noble metal has a higher resistance to migration and a smaller volume shrinkage than the noble metal. Furthermore, atoms constituting the dielectric film can be prevented from being diffused during the heat treatment on the dielectric film, because a film of an oxide, a nitride, or an oxynitride of a noble metal is generally chemically stable. This can suppress a decrease in the polarization of the dielectric. Therefore, the reliability of the dielectric can be maintained to realize a stable electrode.

A second method for fabricating a semiconductor device of the present invention comprises the steps of: (a) forming a first conductive film in the form of an island on an insulating film on a substrate or forming the upper part of the insulating film to have an uneven shape in cross section and thereafter forming a first conductive film along the formed uneven shape; (b) forming a dielectric film on the first conductive film; (c) forming a second conductive film on the dielectric film; and (d) crystallizing the formed dielectric film after the step (c), wherein the first and second conductive films are made of an oxide, a nitride or an oxynitride of a noble metal, and at least one of the first and second conductive films contains a refractory metal.

According to the second method for fabricating a semiconductor device, the conductive film to which the refractory metal is added has a higher resistance to migration and a smaller volume shrinkage than that containing no refractory metal. Therefore, the conductive film can be prevented from being disconnected due to, for example, the heat treatment for crystallizing the dielectric film.

In the steps (a) and (c) of the first or second method for fabricating a semiconductor device, the first or second conductive film is preferably formed at a temperature of 300° C. through 600° C. both inclusive. This reduces the heat shrinkage of the conductive film due to the heat treatment on the dielectric film and therefore can prevent the conductive film from being disconnected. The reason for this is that the conductive film has already undergone a thermal history at a relatively high temperature of 300° C. through 600° C. both inclusive.

In the step (d) of the first or second method for fabricating a semiconductor device, the dielectric film is subjected to heat treatment at a temperature of 500° C. through 800° C. both inclusive.

In the first or second method for fabricating a semiconductor device, the difference between the heating temperature at which the dielectric film is crystallized and the temperature at which the first and second conductive films are formed preferably falls within 200° C. This reduces the heat shrinkage of the conductive film due to the heat treatment on the dielectric film and therefore can prevent the conductive film from being disconnected. The reason for this is that, for example, when heat treatment is performed on the dielectric film at a higher temperature than the temperature during the conductive film formation is formed to improve the quality of the dielectric film, the conductive film has already undergone a thermal history within a difference of 200° C. from the temperature of the heat treatment.

It is preferable that the first or second method for fabricating a semiconductor device further comprises the step (e) of, before the step (d), performing heat treatment on the first and second conductive films at a temperature higher than the temperature at which the first and second conductive films are formed and lower than the temperature at which the dielectric film is crystallized. This reduces the heat shrinkage of the conductive film due to the heat treatment for crystallizing the dielectric film and therefore can prevent the conductive film from being disconnected. The reason for this is that, before the crystallization of the dielectric film, the conductive film is subjected to heat treatment at a temperature higher than the temperature during the conductive film formation and lower than the temperature at which the dielectric is crystallized.

It is preferable that the first or second method for fabricating a semiconductor device further comprises the step (f) of, after the step (c) and before the step (d), forming a protective insulating film to cover the second conductive film. Thus, the second conductive film is not directly exposed to a high-temperature atmosphere during the heat treatment for improving the quality of the dielectric film, because of the existence of the protective insulating film formed on the conductive film. In addition, the heat shrinkage of the second conductive film is reduced. Therefore, the second conductive film can be prevented from being disconnected.

In the first or second method for fabricating a semiconductor device, the step (a) preferably comprises the step of, before the formation of the first conductive film, forming, on the insulating film, an adhesion layer for enhancing the adhesion between the insulating film and the first conductive film. This further improves the resistance of the first conductive film to migration.

In the first method for fabricating a semiconductor device, at least one of the first and second conductive films preferably contains a refractory metal.

In the first or second method for fabricating a semiconductor device, the noble metal preferably includes iridium as its main ingredient.

In the first or second method for fabricating a semiconductor device, the dielectric film is preferably a ferroelectric film of a perovskite oxide.

DETAILED DESCRIPTION OF THE INVENTION

Embodiment 1

A first embodiment of the present invention will be described with reference to the drawings.

Figure 1:
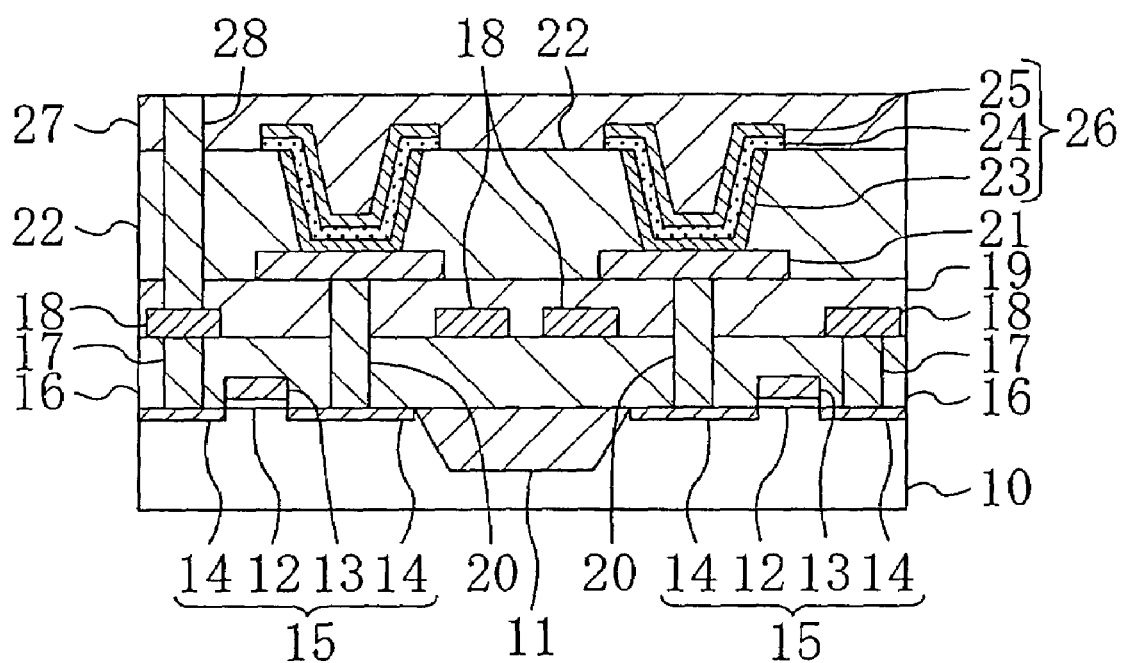
FIG. 1 shows a cross-sectional structure of a semiconductor device according to a first embodiment of the present invention.

FIG. 1 shows a cross-sectional structure of a semiconductor memory device according to a first embodiment of the present invention.

As shown in FIG. 1, element formation regions are defined by a shallow trench isolation (STI) region 11 formed in the upper part of a semiconductor substrate 10 made of silicon (Si). The element formation regions are formed with a plurality of transistors 15 each composed of a gate electrode 13 with a gate insulating film 12 interposed between the gate electrode 13 and the semiconductor substrate 10 and impurity diffusion layers 14 formed to both sides of the gate electrode 13, respectively.

On the semiconductor substrate 10, an approximately 0.4- to 0.8-μm-thick first interlayer insulating film 16 of silicon oxide is formed to cover each transistor 15. In this case, there is preferably used, as silicon oxide, so.called Boron.Phosphorous.Silicate Glass (BPSG), so.called High Density Plasma.Non.doped Silicate Glass (HDP-NSG), or $O_3$-NSG using ozone ($O_3$) for an oxygen atmosphere. BPSG is silicate glass doped with boron (B) and phosphorus (P). HDP-NSG is silicate glass formed using high density plasma and doped with neither boron nor phosphorus.

A first contact plug 17 is formed on one of the impurity diffusion layers 14 of each transistor 15 and in the first interlayer insulating film 16 to allow electrical connection with the impurity diffusion layer 14. Tungsten (W), molybdenum (Mo), titanium (Ti), titanium nitride (TiN), or tantalum nitride (TaN) is used as a material of the first contact plug 17. Metal silicide of titanium (Ti), nickel (Ni) or cobalt (Co) or copper (Cu), or polycrystalline silicon doped with impurities may also be used for the first contact plug 17.

A plurality of bit lines 18 of tungsten or polycrystalline silicon are selectively formed on the first interlayer insulating film 16 whose top is planarized, thereby allowing electrical connection with the first contact plugs 17.

A second interlayer insulating film 19 is formed on the first interlayer insulating film 16 to cover each bit line 18. The second interlayer insulating film 19 requires enough thickness to prevent each bit line 18 from being oxidized.

A second contact plug 20 is formed on the other impurity diffusion layer 14 of each transistor 15 and in the first and second interlayer insulating films 16 and 19 to allow electrical connection with the impurity diffusion layer 14. A material equivalent to that used for the first contact plug 17 is used for the second contact plug 20.

A plurality of oxygen barrier films 21 are formed on the second interlayer insulating film 19 whose top is planarized. They are electrically connectable with the second contact plugs 20, respectively, and cover not only the second contact plug 20 but also parts of the second interlayer insulating film 19 adjacent to the second contact plugs 20. Examples of materials used for each oxygen barrier film 21 include titanium aluminum nitride (TiAlN), titanium aluminum oxynitride (TiAlON), titanium nitride (TiN), iridium oxide ($IrO_x$), iridium (Ir), ruthenium oxide ($RuO_x$), and ruthenium (Ru). Alternatively, each oxygen barrier film 21 may have a layered structure consisting of at least two of them. In this case, x in general formulae of iridium oxide and ruthenium oxide represents a positive real number.

A third interlayer insulating film 22 is formed on the second interlayer insulating film 19 to have openings exposing the oxygen barrier films 21, and thereby a part of the third interlayer insulating film 22 located over each oxygen barrier film 21 has a thickness of approximately 300 nm through 700 nm. The thickness of the part of the third interlayer insulating film 22 serves as a parameter for determining the capacitance value of a capacitive element that will be described later.

A capacitive element 26 composed of lower and upper electrodes 23 and 25 and a capacitor insulating film 24 is formed in each opening of the third interlayer insulating film 22 along the wall and bottom surfaces of the opening. The lower and upper electrodes 23 and 25 are made of, for example, an oxide, a nitride or an oxynitride of a noble metal. Specific materials of the lower and upper electrodes 23 and 25 include oxides, nitrides or oxynitrides of platinum (Pt), iridium (Ir), ruthenium (Ru), gold (Au), silver (Ag), palladium (Pd), rhodium (Rh) or osmium (Os). For example, if an oxide is to be used, the specific material is iridium oxide ($IrO_2$), ruthenium oxide ($RuO_2$), or silver oxide ($Ag_2O$).

If there is used, as the capacitor insulating film 24, a barium strontium titanate ($Ba_xSr_{1-x}TiO_3$) (where $0 \leq x \leq 1$ and hereinafter referred to as BST) based dielectric that is a ferroelectric material, a perovskite dielectric containing lead such as lead zirconium titanate ($Pb(Zr_xTi_{1-x})O_3$) (where $0 \leq x \leq 1$ and hereinafter referred to as PZT) or lead lanthanum zirconium titanate ($Pb_yLa_{1-y}(Zr_xTi_{1-x})O_3$) (where $0 \leq x$ and $y \leq 1$), or a perovskite dielectric containing bismuth such as strontium bismuth tantalite ($Sr_{1-y}Bi_{2+x}Ta_2O_9$) (where $0 \leq x$ and $y \leq 1$, and hereinafter referred to as SBT) or bismuth lanthanum titanate ($Bi_{4-x}La_xTi_3O_{12}$) (where $0 \leq x \leq 1$), a nonvolatile memory device can be fabricated.

A compound of a perovskite structure represented by a general formula of $ABO_3$ (where A and B are different elements) can be used for the ferroelectric film. In this case, the element A is at least one selected from the group consisting of, for example, lead (Pb), barium (Ba), strontium (Sr), calcium (Ca), lanthanum (La), lithium (Li), sodium (Na), potassium (K), magnesium (Mg), and bismuth (Bi).

The element B is at least one selected from the group consisting of, for example, titanium (Ti), zirconium (Zr), niobium (Nb), tantalum (Ta), tungsten (W), iron (Fe), nickel (Ni), scandium (Sc), cobalt (Co), hafnium (Hf), magnesium (Mg), and molybdenum (Mo).

The capacitor insulating film 24 is not limited to a single.layer ferroelectric film. A plurality of ferroelectric films having different compositions may be used instead. Alternatively, the capacitor insulating film 24 may continuously be varied in composition to have a composition gradient.

It is needless to say that the capacitor insulating film 24 is not limited to a ferroelectric film. Silicon oxide ($SiO_2$), silicon nitride ($Si_3N_4$), niobium pentoxide ($Nb_2O_5$), tantalum pentoxide ($Ta_2O_5$), or aluminum oxide ($Al_2O_3$) may be used instead.

A fourth interlayer insulating film 27 is formed on the third interlayer insulating film 22 to fill in the recess of each capacitive element 26. A third contact plug 28 is selectively formed on the first contact plug 17 and in the second, third and fourth interlayer insulating films 19, 22 and 27 to allow electrical connection with the first contact plug 17 and the corresponding bit line 18. Also in this case, a material equivalent to that used for the first contact plug 17 and the second contact plug 20 may be used for the third contact plug 28.

A method for fabricating a semiconductor memory device thus constructed will be described hereinafter with reference to the drawings.

FIGS. 2A through 6C are structural cross.sectional views sequentially illustrating process steps of a method for fabricating a semiconductor device according to the first embodiment of the present invention.

Figure 2A:
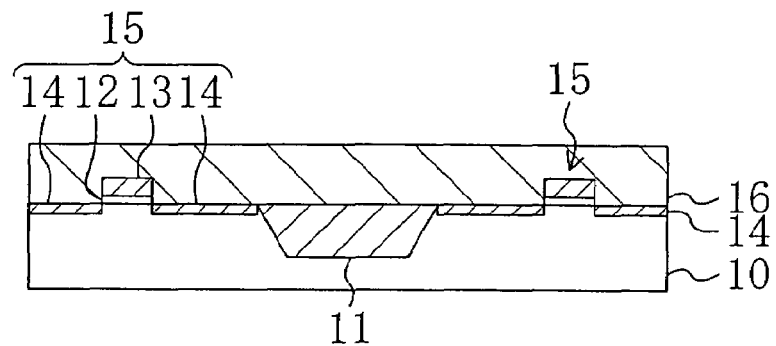
FIGS. 2A through 2D are structural cross-sectional views sequentially illustrating process steps of a method for fabricating a semiconductor device according to the first embodiment of the present invention.

First, as shown in FIG. 2A, an STI region 11 is selectively formed in the upper part of a semiconductor substrate 10. The semiconductor substrate 10 is partitioned into a plurality of element formation regions by the formed STI region 11. Subsequently, each element formation region is formed successively with an about 3 nm.thick gate insulating film 12 made of, for example, silicon oxide or silicon oxynitride and an about 200 nm.thick gate electrode 13 containing polycrystalline silicon, metal or metal silicide. Then, impurity diffusion layers 14 are formed by implanting impurity ions into the semiconductor substrate 10 using the gate electrode 13 as a mask. In this way, a transistor 15 is formed in each element formation region. Subsequently, an insulating film of BPSG, HDP.NSG or $O_3$-NSG is formed with a thickness of approximately 0.6 μm through 1.2 μm. Thereafter, the surface of the formed insulating film is planarized by a chemical mechanical polishing (CMP) method to form a first insulating film 16 with a thickness of 0.4 μm through 0.8 μm.

Figure 2B:
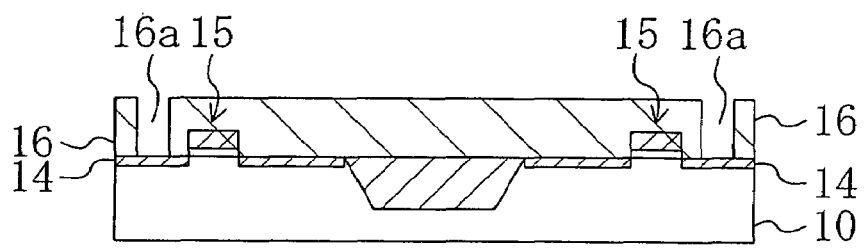

Next, as shown in FIG. 2B, first contact holes 16a are formed in the first interlayer insulating film 16 by lithography and dry etching to expose one of the impurity diffusion layers 14 of each transistor 15.

Figure 2C:
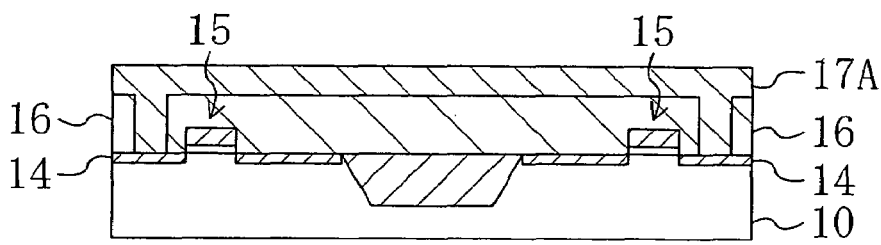

Next, as shown in FIG. 2C, a first contact plug formation film 17A is formed on the first interlayer insulating film 16 by sputtering, CVD or plating to fill in the first contact holes 16a. In this case, as described above, the first contact plug formation film 17A employs a metal such as tungsten, metal nitride such as titanium nitride, metal silicate such as titanium silicate, copper, or polycrystalline silicon. Before the formation of the first contact plug formation film 17A, there may be formed an adhesion layer made of a layered film obtained by successively layering titanium and titanium nitride or tantalum and tantalum nitride from the substrate side.

Figure 2D:
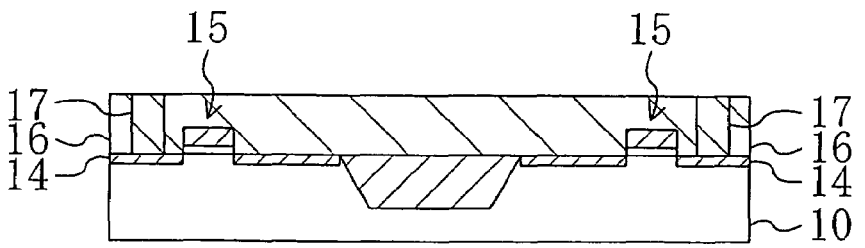

Next, as shown in FIG. 2D, the formed first contact plug formation film 17A is subjected to an etch back or CMP process until the first interlayer insulating film 16 is exposed. In this way, first contact plugs 17 are formed from the first contact plug formation film 17A, each to allow electrical connection with one of the impurity diffusion layers 14 of the associated transistor 15.

Figure 3A:
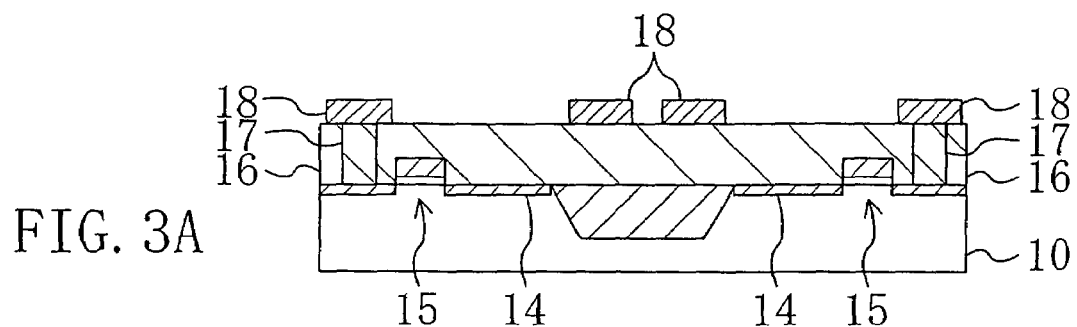
FIGS. 3A through 3D are structural cross-sectional views sequentially illustrating subsequent process steps of the method for fabricating a semiconductor device according to the first embodiment of the present invention.

Next, as shown in FIG. 3A, a conductive film of, for example, tungsten or polycrystalline silicon is formed on the first interlayer insulating film 16 by sputtering or CVD or in a furnace. Subsequently, the conductive film is patterned by lithography and etching to allow electrical connection with the first contact plugs 17. In this way, a plurality of bit lines 18 are formed from the conductive film. In this case, when the material of the bit line 18 is tungsten, for example, a mixture of a chlorine.based gas and a fluorine.based gas is used as the etching gas. On the other hard, when the material is polycrystalline silicon, a fluorine.based gas is used. When tungsten is used for the bit line 18, there may be formed an adhesion layer made of a layered film obtained by successively layering, for example, titanium and titanium nitride from the substrate side before the formation of the tungsten film. The thickness of each bit line 18 is determined depending on its interconnect resistance and design rule and is preferably about 20 nm through 150 nm. Furthermore, when a stacked contact plug is formed between the corresponding bit line 18 and an interconnect located above the capacitive element, a bit line pattern may be formed to selectively cover one of the first contact plugs 17.

Figure 3B:
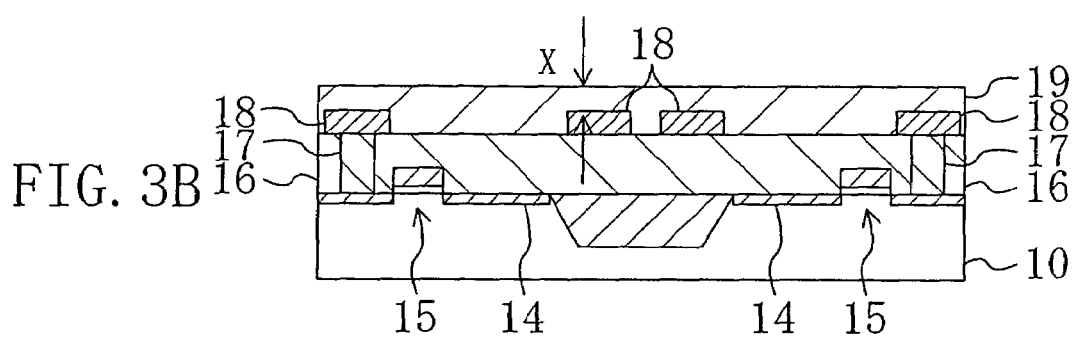

Next, as shown in FIG. 3B, an approximately 200- to 800-nm-thick second interlayer insulating film 19 of BPSG or the like is formed by CVD on the first interlayer insulating film 16 to cover the bit lines 18. Subsequently, the formed second interlayer insulating film 19 is subjected to CMP, etch back and reflow and thereby planarized. This planarization facilitates the formation of a capacitive element that will be placed above the second interlayer insulating film 19. In particular, the use of CMP enables further planarization of steps on the top of the second interlayer insulating film 19 caused by the bit line 18. The thickness X of a part of the second interlayer insulating film 19 located over each bit line 18 is preferably set at 50 nm through 500 nm, sufficient to prevent each bit line 18 from being oxidized.

Figure 3C:
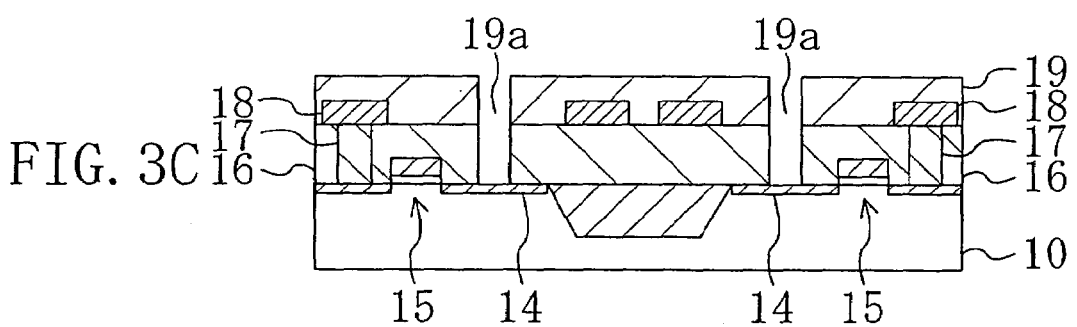

Next, as shown in FIG. 3C, second contact holes 19a are formed in the first and second interlayer insulating films 16 and 19 by lithography and dry etching to expose the other impurity diffusion layer 14 of each transistor 15.

Figure 3D:
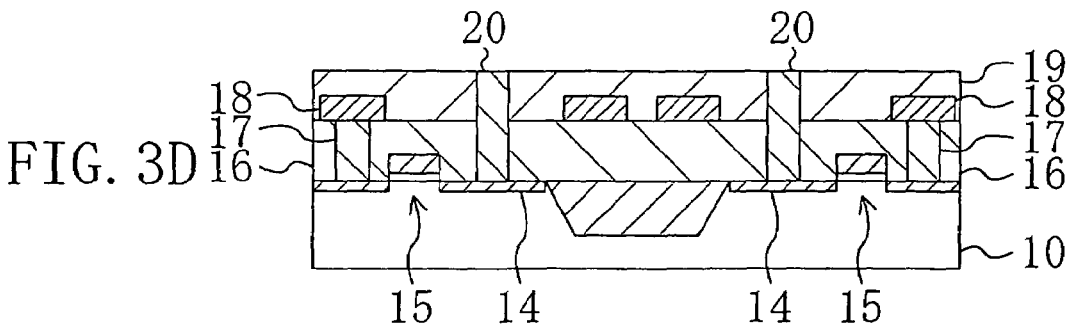

Next, as shown in FIG. 3D, a second contact plug formation film (not shown) is formed on the second interlayer insulating film 19 by sputtering, CVD or plating to fill in the second contact holes 19a. In this case, the material of the second contact plug formation film may be equivalent to that of the first contact plug 17. Also in this case, before the formation of the second contact plug formation film, an adhesion layer may be formed which consists of a layered film of titanium nitride and titanium or tantalum nitride and tantalum. Thereafter, the formed second contact plug formation film is subjected to an etch back or CMP process until the second interlayer insulating film 19 is exposed. In this way, second contact plugs 20 are formed from the second contact plug formation film, each to allow electrical connection with the other impurity diffusion layer 14 of the associated transistor 15.

Figure 4A:
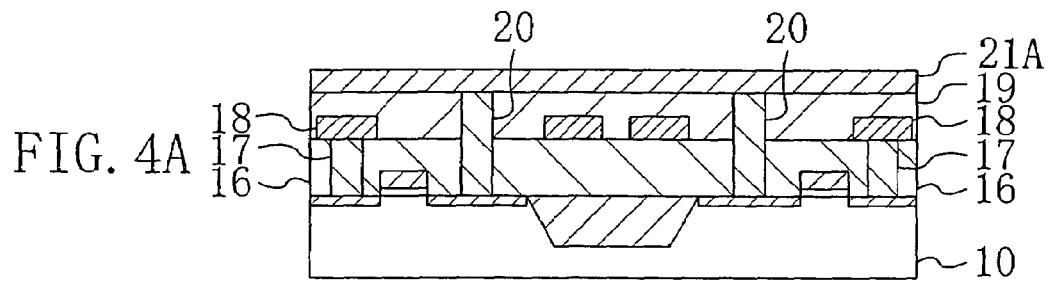
FIGS. 4A through 4D are structural cross-sectional views sequentially illustrating process steps of the method for fabricating a semiconductor device according to the first embodiment of the present invention.

Next, as shown in FIG. 4A, a 50- to 250-nm-thick oxygen barrier formation film 21A is formed over the top surface of the second interlayer insulating film 19, for example, by sputtering, CVD or Metal Organic Chemical Vapor Deposition (MOCVD) to prevent the second contact plug 20 from being oxidized. As described above, there is used, as a material of the oxygen barrier formation film 21A, titanium nitride, titanium aluminum nitride, titanium aluminum oxynitride, iridium or an oxide thereof, or ruthenium or an oxide thereof.

Figure 4B:
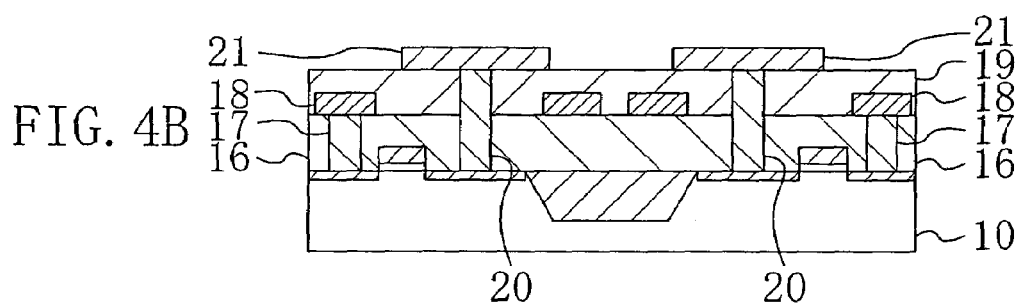

Next, as shown in FIG. 4B, a plurality of oxygen barrier films 21 are formed from the oxygen barrier formation film 21A by patterning the oxygen barrier formation film 21A to cover the second contact plugs 20 and their surrounding areas by lithography and dry etching using combination of a chlorine.based gas with a fluorine.based gas. Alternatively, although not shown, oxygen barrier films 21 may be filled into recesses produced at the top ends of the second contact plugs 20 in removing the second contact plug formation film from the top of the second interlayer insulating film 19.

Figure 4C:
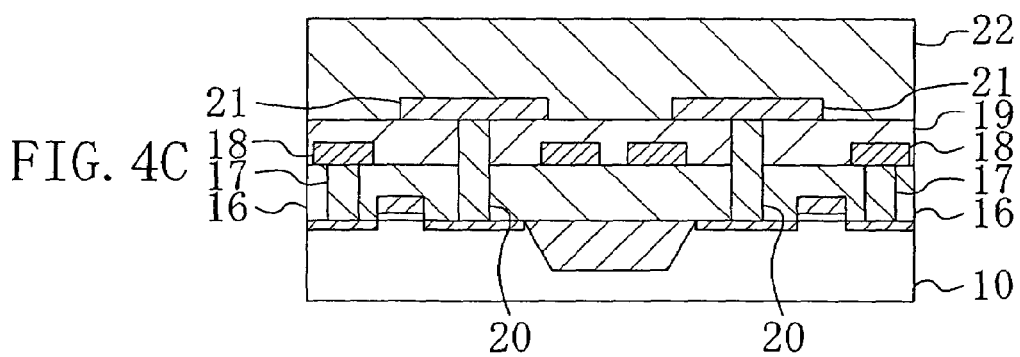

Next, as shown in FIG. 4C, an approximately 900-to 1400-nm-thick third interlayer insulating film 22 of BPSG or the like is formed by CVD on the second interlayer insulating film 19 to cover the oxygen barrier films 21. Subsequently, the formed third interlayer insulating film 22 is planarized by CMP. At this time, the thickness of a part of the third interlayer insulating film 22 located over each oxygen barrier film 21 serves as a parameter for determining the capacitance value of a capacitive element and is preferably about 300 nm through 700 nm in this embodiment.

Figure 4D:
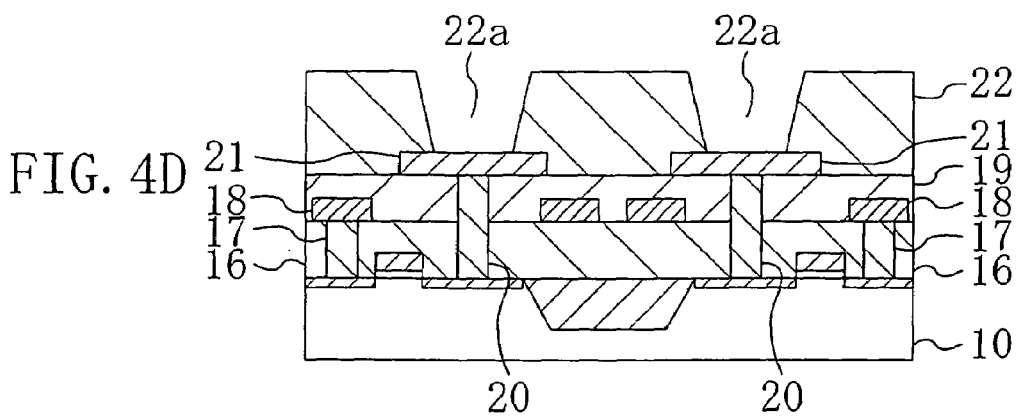

Next, as shown in FIG. 4D, a plurality of openings 22a are formed by lithography and etching in the third interlayer insulating film 22 to expose the middle parts of the oxygen barrier films 21, i.e., parts of the oxygen barrier films 21 over the second contact plugs 20. In this case, either of dry etching and wet etching may be used to form the openings 22a.

The diameter of each opening 22a expands from its bottom toward its top. More particularly, the wall surfaces of each opening form a tapered shape in cross section as shown in FIG. 4D.

Figure 5A:
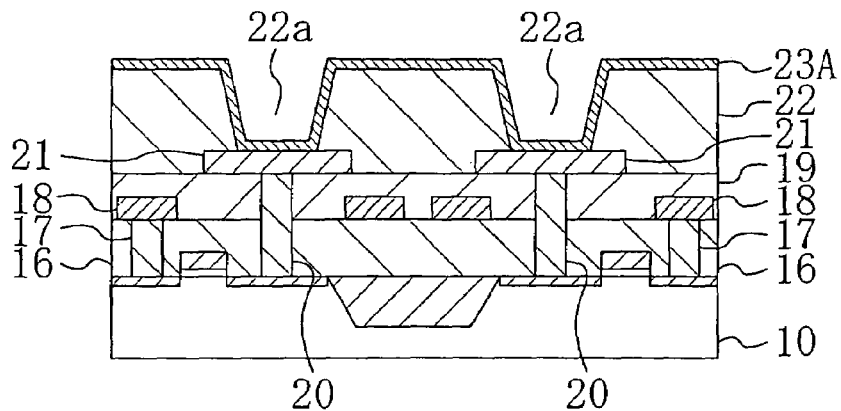
FIGS. 5A through 5D are structural cross-sectional views sequentially illustrating subsequent process steps of the method for fabricating a semiconductor device according to the first embodiment of the present invention.

Next, as shown in FIG. 5A, an approximately 20- to 60-nm-thick lower electrode formation film 23A is formed by sputtering, CVD or MOCVD over the entire surface of the third interlayer insulating film 22 including the wall and bottom surfaces of the openings 22a under a temperature of about 200° C. through 500° C. The lower electrode formation film 23A consists of an oxide, a nitride or an oxynitride of a noble metal such as platinum or indium.

A description will be given below of the film formation conditions under the use of iridium oxide ($IrO_2$) for the lower electrode formation film 23A.

First, the film formation conditions in forming the lower electrode formation film 23A of iridium oxide by sputtering are represented as follows:

Target Material: Iridium (Ir)
Substrate Temperature: 300° C. through 500° C.
Pressure: 0.5 Pa through 0.8 Pa
Power: 0.8 kW through 3.5 kW
Sputter Gas: Argon (Ar)
Oxidizing Gas: Oxygen ($O_2$)
Gas Ratio: $O_2$/Ar=1 through 3

Next, the film formation conditions in forming the lower electrode formation film 23A of iridium oxide by MOCVD instead of sputtering are represented as follows:

Metal-Organic Material containing iridium (Precursor) :dimethyl.iridium cyclooctadiene
Solvent: Tetrahydrofuran
Temperature of Vaporizer: 60° C. through 120° C.
Oxidizing Gas: Oxygen ($O_2$) [at a flow rate of 50 through 150 ml/min]
Carrier Gas: Argon (Ar) [at a flow rate of 150 through 250 ml/min]
Pressure: 133 Pa through 266 Pa
Temperature: 250° C. through 450° C.

In the case of use of sputtering, a film made of a nitride of a noble metal is formed using nitrogen gas, and a film made of an oxynitride of a noble metal is formed using nitrogen gas and oxygen gas. On the other hand, in the case of use of MOCVD, a film is formed using a material containing nitrogen or oxygen as appropriate. As a result, the lower electrode formation film 23A can have a polycrystalline structure under the use of either sputtering or MOCVD.

When the lower electrode formation film 23A is formed using MOCVD, the lower electrode formation film 23A has a good coverage over the wall and bottom surfaces of the openings 22a of the third interlayer insulating film 22. In addition, since an oxide or a nitride of a noble metal is used for the lower electrode formation film 23A, the shrinkage of the electrode formation film is reduced. Therefore, the electrode formation film can be prevented from being disconnected.

Figure 5B:
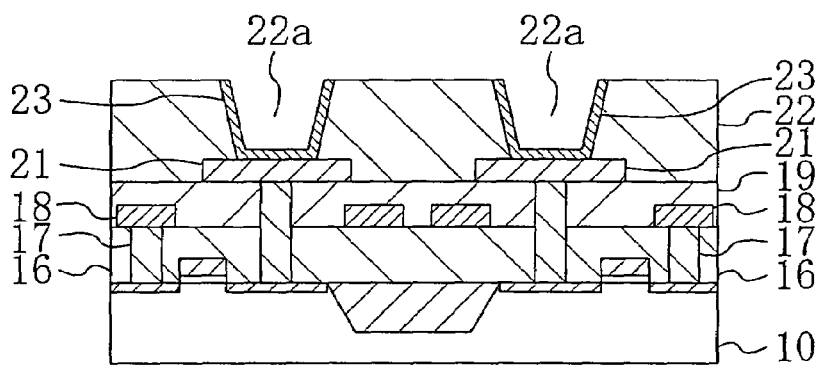

Next, as shown in FIG. 5B, parts of the lower electrode formation film 23A deposited on the top of the third interlayer insulating film 22, i.e., parts thereof other than located in the openings 22a, are removed by CMP to expose the top of the third interlayer insulating film 22. In this way, lower electrodes 23 are formed from the lower electrode formation film 23A on the wall and bottom surfaces of the openings 22a of the third interlayer insulating film 22.

In this relation, instead of using CMP, an insulating film (unshown sacrificing film) may be deposited on the entire surface of the third interlayer insulating film 22 to fill in the recesses of the lower electrodes 23 formed in the openings 22a of the third interlayer insulating film 22, and then the deposited insulating film may be etched back as a whole by dry etching. In this way, the lower electrode formation film 23A other than parts thereof that will be the lower electrode 23 may be removed until the third interlayer insulating film 22 is exposed. Thereafter, the sacrificing film on the lower electrodes 23 is removed by wet etching using hydro.fluoric acid (HF) or the like.

Figure 5C:
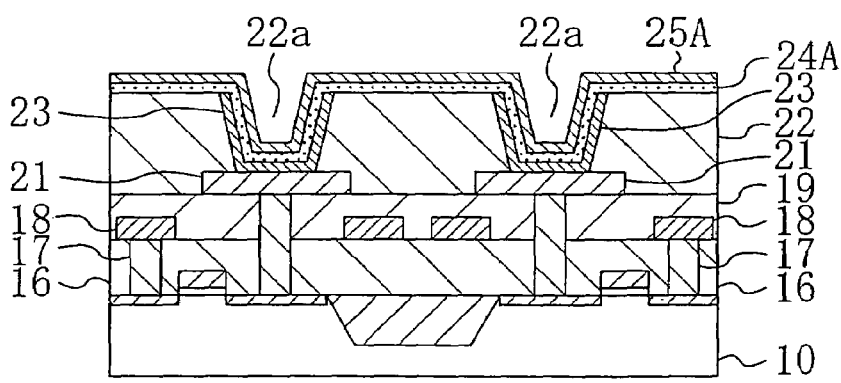

Next, as shown in FIG. 5C, a 40- to 100-nm-thick capacitor insulating film formation film 24A of, for example, a ferroelectric material is formed by sputtering or MOCVD over the entire surface of the third interlayer insulating film 22 including the surfaces of the lower electrodes 23 of a concave shape in cross section. As described above, a ferroelectric material such as BST, PZT or SBT is used for the capacitor insulating film formation film 24A.

Subsequently, a 20-nm-thick upper electrode formation film 25A is formed by sputtering, CVD, or MOCVD on the capacitor insulating film formation film 24A on the film formation conditions equivalent to those of the lower electrode formation film 23A. The upper electrode formation film 25A consists of a polycrystal of an oxide, a nitride or an oxynitride of a noble metal such as platinum or iridium. In the first embodiment, an underlying layer of the lower electrode formation film 23A and the upper electrode formation film 25A is the third interlayer insulating film 22 having the openings 22a.

Figure 5D:
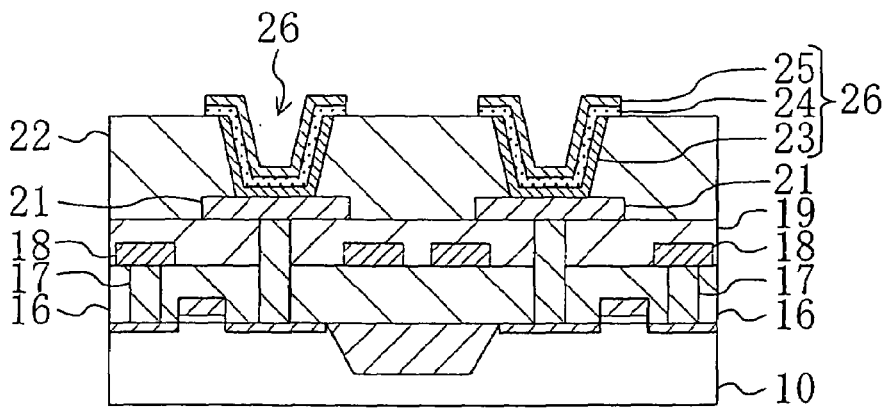

Next, as shown in FIG. 5D, the capacitor insulating film formation film 24A and the upper electrode formation film 25A are patterned by lithography and dry etching using combination of a chlorine.based gas with a fluorine.based gas to cover the lower electrodes 23. In this way, the capacitor insulating films 24 are formed from the capacitor insulating film formation film 24A, and the upper electrodes 25 are formed from the upper electrode formation film 25A. As a result, capacitive elements 26 each consisting of the lower electrode 23, the capacitor insulating film 24 and the upper electrode 25 are formed to have concave shapes in cross section.

Figure 6A:
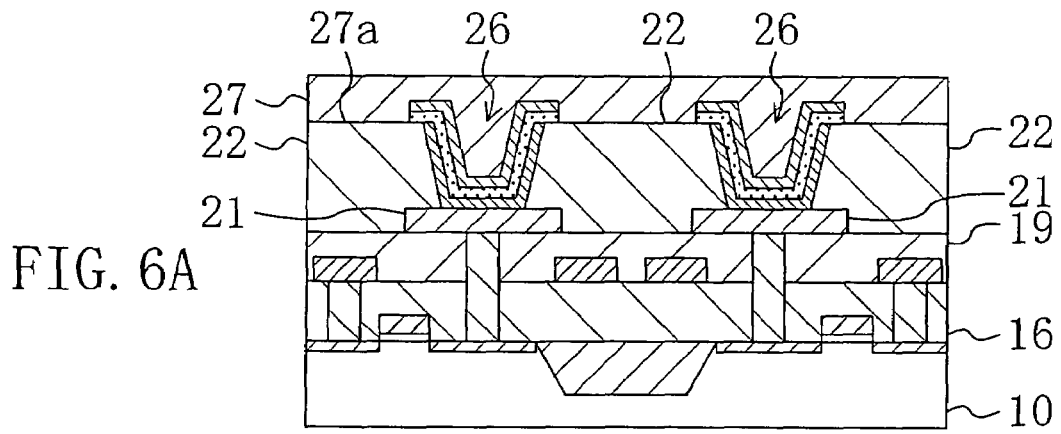
FIGS. 6A through 6C are structural cross-sectional views sequentially illustrating subsequent process steps of the method for fabricating a semiconductor device according to the first embodiment of the present invention.

Next, as shown in FIG. 6A, a fourth interlayer insulating film 27 of BPSG or the like is formed by CVD on the third interlayer insulating film 22 to cover the capacitive elements 26. Thereafter, the surface of the formed fourth interlayer insulating film 27 is planarized by CMP. A part of the planarized fourth interlayer insulating film 27 located over the upper end of the capacitive element 26 preferably has a thickness of 100 through 300 nm. Subsequently, heat treatment is performed on the capacitor insulating films 24 at a high temperature in an oxygen atmosphere to improve the quality of the capacitor insulating films 24, for example, to crystallize a ferroelectric material constituting the capacitor insulating films 24. This heat treatment may be annealing using a furnace or by Rapid Thermal Annealing (RTA). The heating temperature is preferably 500° C. through 800° C. both inclusive. Furthermore, the difference between the temperature at which heat treatment is performed on the capacitor insulating films 24 and the temperature at which the lower and upper electrodes 23 and 25 are formed preferably falls within 200° C. For example, when the heating temperature for improving the quality of the capacitor insulating films 24 is 700° C., the lower and upper electrodes 23 and 25 are preferably formed at a temperature of 500° C. or more.

The above heat treatment may be performed to improve the quality of the capacitor insulating films 24 before the formation of the fourth interlayer insulating film 27. However, the present inventors have found that heat treatment performed with the upper electrodes 25 covered with an insulating film provides a smaller heat shrinkage of each upper electrode 25 than heat treatment performed with the upper electrodes 25 exposed to a heat atmosphere. Therefore, heat treatment for improving the quality of the capacitor insulating films 24 is preferably performed after the formation of the fourth interlayer insulating film 27.

Furthermore, another heat treatment is preferably performed on the upper electrodes 25 at a temperature higher than the temperature at which the upper electrodes 25 are formed and lower than the temperature at which a ferroelectric material constituting the capacitor insulating films 24 is crystallized, after the formation of the upper electrodes 25 and before the heat treatment for improving the quality of the capacitor insulating films 24. In this embodiment, for example, after the formation of the upper electrode formation film 25A, the heat treatment is preferably performed thereon at approximately 600° C. for approximately 60 seconds. Moreover, a stress due to the shrinkage of each upper electrode 25 during heat treatment increases with the increasing area of the upper electrode formation film 25A. Therefore, the heat treatment is more preferably performed after the patterning of the upper electrode formation film 25A. Accordingly, before the heat treatment for improving the quality of the capacitor insulating films 24, the lower and upper electrodes 23 and 25 are previously subjected to heat treatment at a temperature higher than the temperature at which these electrodes are formed and lower than the temperature at which the ferroelectric material constituting the capacitor insulating films 24 is crystallized. Therefore, each electrode 23, 25 is restrained from rapidly heat-shrinking during the heat treatment for the crystallization of the capacitor insulating films 24. As a result, each electrode 23, 25 can be prevented from being disconnected.

Figure 6B:
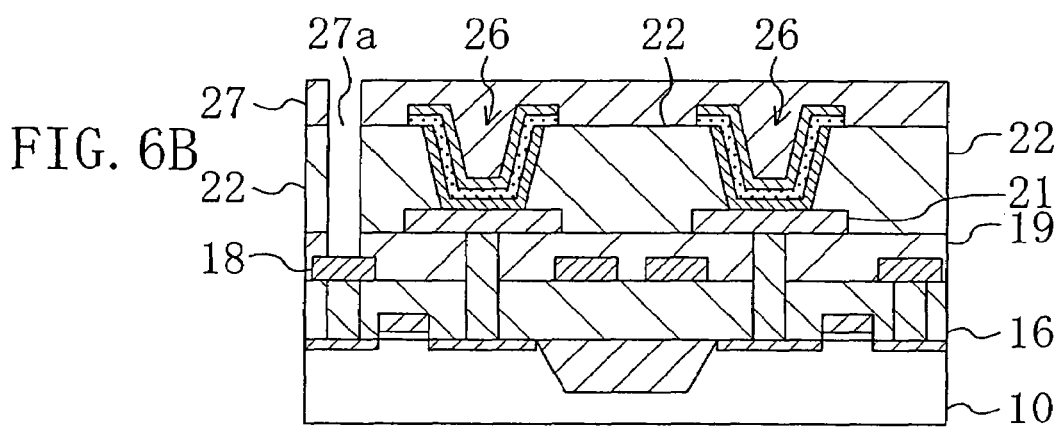

Next, as shown in FIG. 6B, a third contact hole 27a is formed, by lithography and dry etching, through the fourth interlayer insulating film 27, the third interlayer insulating film 22 and the second interlayer insulating film 19 to expose the corresponding bit line 18.

Figure 6C:
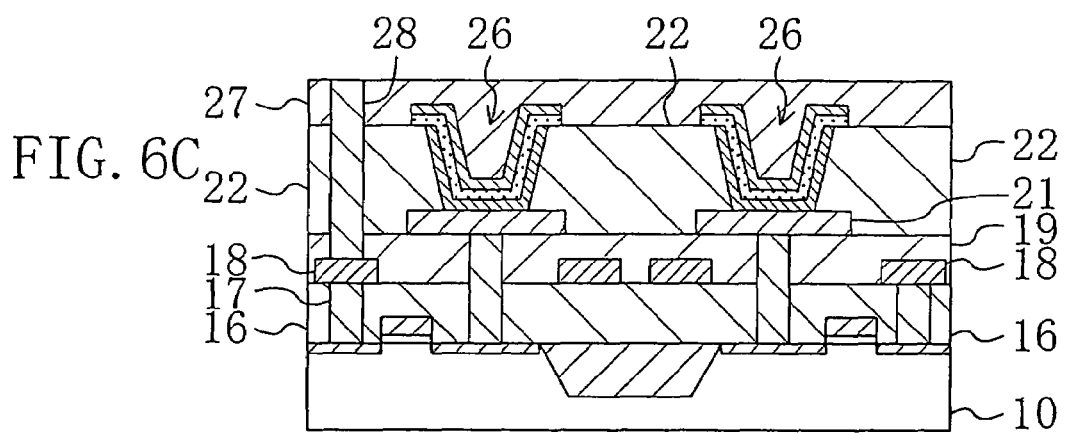

Next, as shown in FIG. 6C, a third contact plug formation film (not shown) is formed, by sputtering, CVD or plating, on the fourth interlayer insulating film 27 to fill in the third contact hole 27a. In this case, the material of the third contact plug formation film may be equivalent to that of the first contact plug 17. Also in this case, before the formation of the third contact plug formation film, an adhesion layer of a layered film of titanium nitride and titanium or tantalum nitride and tantalum may be formed on the fourth interlayer insulating film 27. Thereafter, the formed third contact plug formation film is subjected to an etch back or CMP process until the fourth interlayer insulating film 27 is exposed. A third contact plug 28 is thereby formed from the third contact plug formation film to allow electrical connection with the corresponding bit line 18. In this way, a so-called stacked contact is formed of the first contact plug 17, the bit line 18 and the third contact plug 28.

Figure 7:
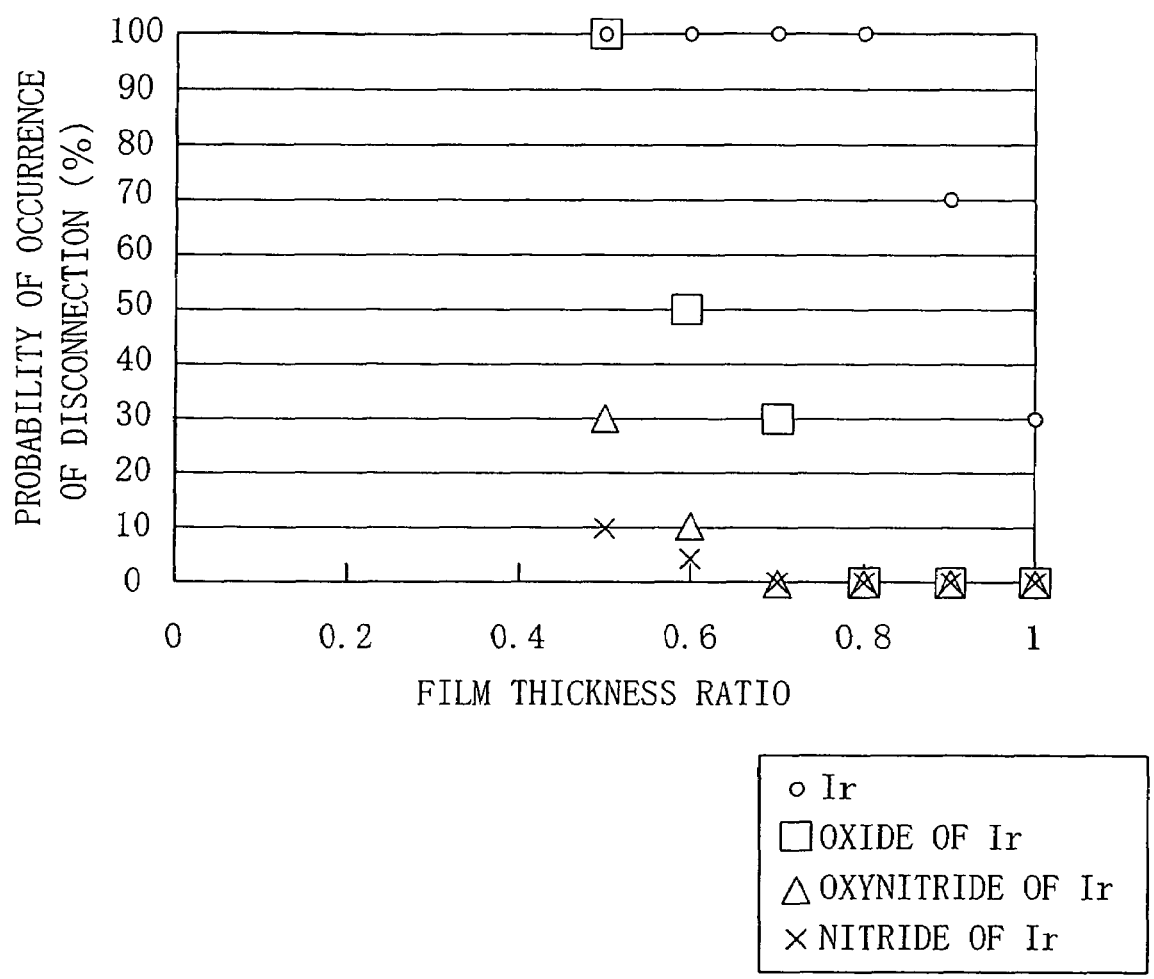
FIG. 7 is a graph illustrating the relationship between the film thickness ratio between the thinnest and thickest parts of a conductive film and the probability of occurrence of disconnection in the conductive film in the method for fabricating a semiconductor device according to the first embodiment of the present invention.

A description will be given of the probability of occurrence of disconnection of each electrode (conductive film) in the capacitive element thus formed with reference to FIG. 7. FIG. 7 shows, for each of electrodes using iridium (Ir), iridium oxide ($IrO_x$), iridium nitride (IrN), and iridium oxynitride (IrON) as their electrode materials, the relationship between the film thickness ratio of the electrode between its thinnest and thickest parts and the probability of occurrence of disconnection due to heat treatment on the capacitor insulating film.

As shown in FIG. 7, where iridium was used as an electrode material, the probability of occurrence of disconnection was 100% at a film thickness ratio of 0.8 or less. Even when the film thickness of each electrode was uniform, i.e., at a film thickness ratio of 1.0, the probability of occurrence of disconnection was 30%. On the other hand, where iridium oxide was used as an electrode material, the probability of occurrence of disconnection was 0% within the range of film thickness ratios between 0.8 and 1.0 both inclusive. Furthermore, where iridium nitride was used as an electrode material, the probability of occurrence of disconnection was 10% or less within the range of film thickness ratios between 0.6 and 1.0 both inclusive and was 0% within the range of film thickness ratios between 0.7 and 1.0 both inclusive. Where iridium oxynitride was used for an electrode, the probability of occurrence of disconnection was 10% or less within the range of film thickness ratios between 0.5 and 1.0 both inclusive and was 0% within the range of film thickness ratios between 0.7 and 1.0 both inclusive. To sum up, when an electrode is formed using an oxide, a nitride or an oxynitride of a noble metal so that the film thickness ratio between the maximum and minimum thicknesses of the formed electrode is 0.8 through 1.0 both inclusive, the capacitive element can be prevented from being disconnected.

When the thickness of the thinnest part of each electrode is approximately 15 nm, a primary role as an electrode is not degraded and disconnection is hardly produced.

Accordingly, the use of an oxide, a nitride or an oxynitride of a noble metal for each electrode of a capacitive element can further restrain each electrode from being disconnected as compared with the use of a noble metal therefor. Furthermore, the use of a nitride of a noble metal for the electrode can most effectively restrain disconnection.

As described above, in the first embodiment, only an oxide, a nitride or an oxynitride of a noble metal is used for the lower and upper electrodes 23 and 25 of so-called concave capacitive elements 26 of a concave shape in cross section. Therefore, the lower and upper electrodes 23 and 25, in particular, the upper electrode 25 can be prevented from being disconnected during the heat treatment for the crystallization of the capacitor insulating films 24 and thereby producing leakage current.

The crystallization of a ferroelectric material requires heat treatment at a relatively high temperature of 500° C. to 800° C. both inclusive. Thus, the effect of the present invention is large.

Furthermore, the use of a ferroelectric material of a perovskite oxide for each capacitor insulating film 24 requires heat treatment at a higher temperature than the use of a paraelectric material such as tantalum pentoxide ($Ta_2O_5$). Thus, the effect of the present invention is large.

Moreover, the use of a perovskite oxide containing bismuth for each capacitor insulating film 24 requires heat treatment at a higher temperature than the use of a perovskite oxide containing lead. Thus, the effect of the present invention is large.

Embodiment 2

A second embodiment of the present invention will be described hereinafter with reference to the drawings.

Figure 8:
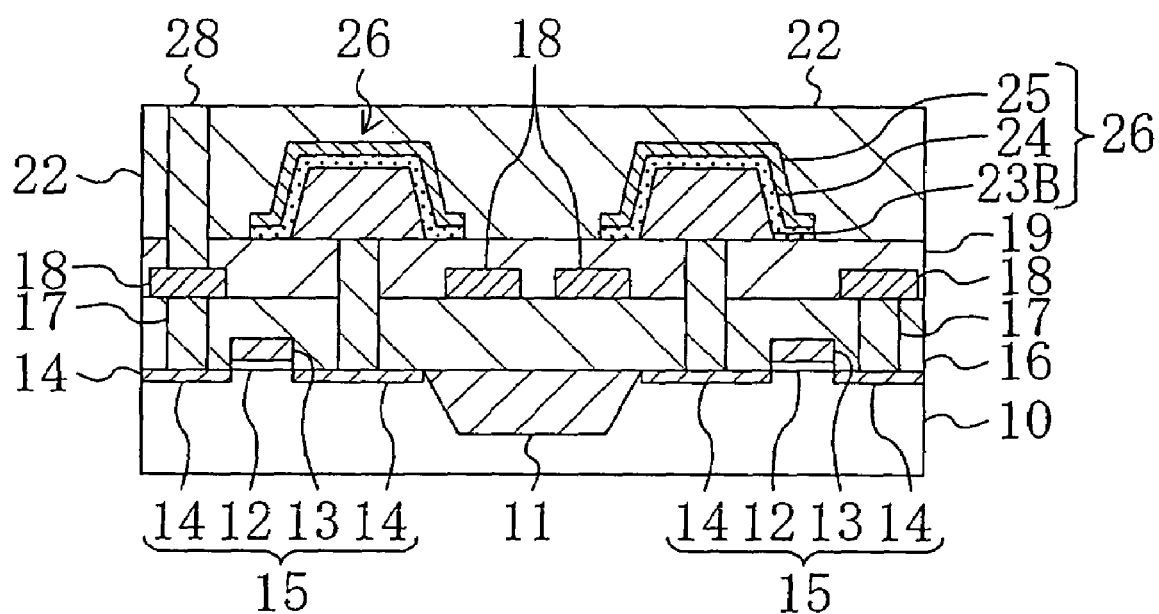
FIG. 8 shows a cross-sectional structure of a semiconductor device according to a second embodiment of the present invention.

FIG. 8 shows a cross.sectional structure of a semiconductor memory device according to the second embodiment of the present invention. In FIG. 8, the same numerals are given to the same components as those shown in FIG. 1. Thus, a description thereof is not given.

As shown in FIG. 8, the second embodiment is characterized in that lower electrodes 23B of, for example, iridium oxide, each constituting a capacitive element 26 are formed on a second interlayer insulating film 19 in the form of an island to have a relatively large thickness of 300 nm through 700 nm. In other words, the lower electrodes 23B are formed to be convex in cross section as shown in FIG. 8.

In this way, a capacitor insulating film 24 of a ferroelectric material such as BST and an upper electrode 25 of, for example, iridium oxide are formed to cover the corresponding island.like lower electrode 23B. Therefore, each of the capacitor insulating film 24 and the upper electrode 25 is convex upward in cross section.

Even if the capacitive elements 26 thus constructed are subjected to heat treatment at a high temperature in an oxygen atmosphere to improve the quality of the capacitor insulating films 24, the convex capacitive elements 26 do not cause disconnection, for example, at their bends, due to the volume shrinkage of the upper electrode 25. The reason for this is that the heat shrinkage of the upper electrode 25 of an oxide of a noble metal such as iridium oxide is smaller than the heat shrinkage of an upper electrode of iridium. Likewise, when there are used upper electrodes 25 of a nitride or an oxynitride of a noble metal such as iridium, the upper electrodes 25 can be restrained from being disconnected due to their heat shrinkage.

A method for fabricating a semiconductor memory device constructed as described above will be described hereinafter with reference to the drawings.

FIGS. 9A through 10C are structural cross.sectional views sequentially illustrating process steps of a method for fabricating a semiconductor memory device according to the second embodiment of the present invention. A description of the same process steps as those in the first embodiment is not given herein, but a description will be given of process steps including and after the step of forming island.like lower electrodes 23B, which is a feature of the second embodiment.

Figure 9A:
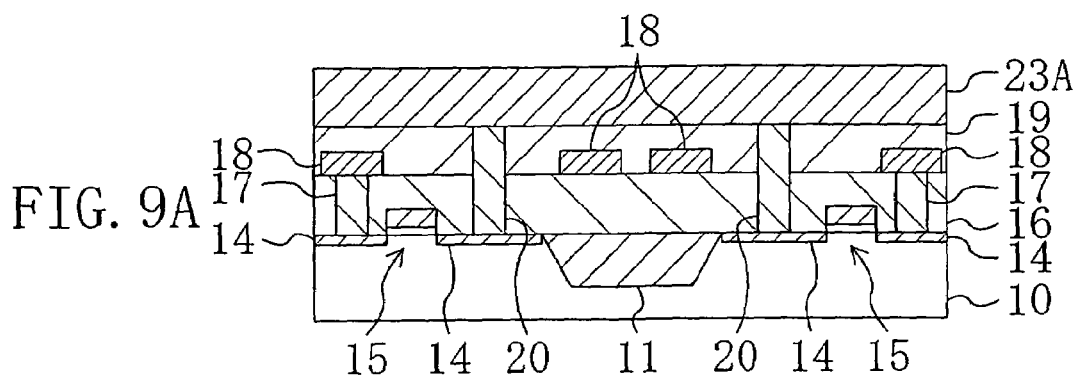
FIGS. 9A through 9D are structural cross-sectional views sequentially illustrating process steps of a method for fabricating a semiconductor device according to the second embodiment of the present invention.

As shown in FIG. 9A, an approximately 500 nm-thick lower electrode formation film 23A is formed by sputtering, CVD or MOCVD over the entire surface of the second interlayer insulating film 19. The lower electrode formation film 23A consists of an oxide, a nitride or an oxynitride of a noble metal such as platinum or iridium.

Figure 9B:
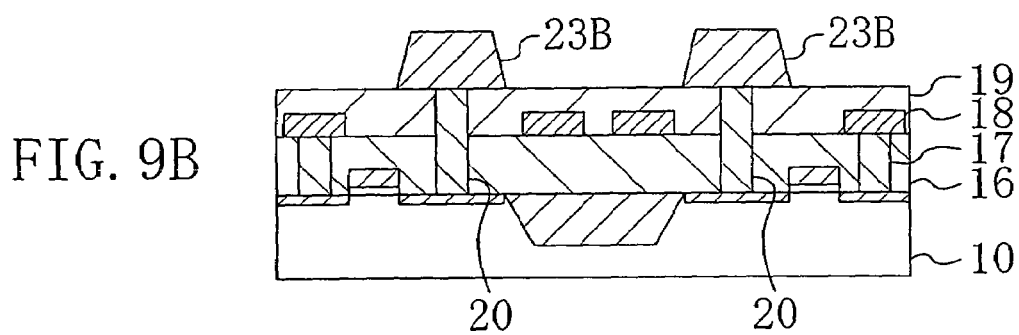

Next, as shown in FIG. 9B, the formed lower electrode formation film 23A is patterned by lithography and dry etching to cover the second contact plugs 20 and their surrounding areas. In this way, a plurality of lower electrodes 23B are formed from the lower electrode formation film 23A.

Figure 9C:
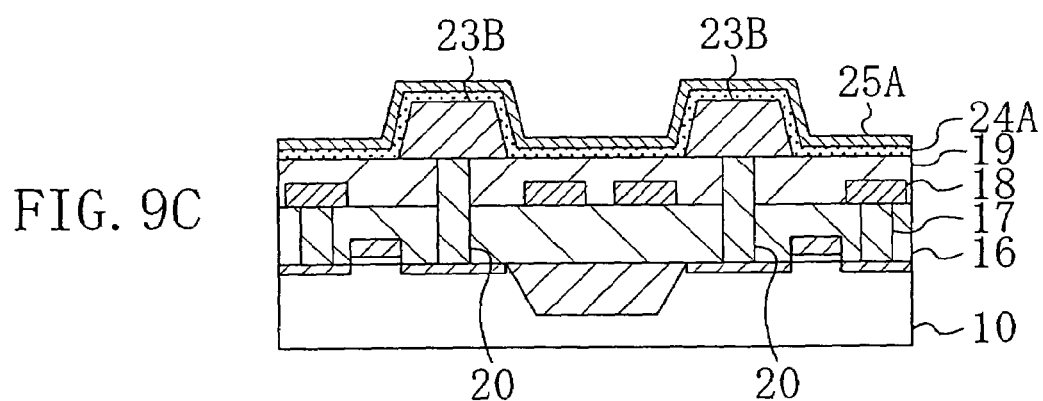

Next, as shown in FIG. 9C, a 50- to 100-nm-thick capacitor insulating film formation film 24A of, for example, a ferroelectric material is formed by sputtering or MOCVD over the entire surface of the second interlayer insulating film 19 to cover the lower electrodes 23B. In this case, a ferroelectric material such as BST, PZT or SBT is used for the capacitor insulating film formation film 24A. Subsequently, a 20-nm-thick upper electrode formation film 25A is formed by sputtering or MOCVD on the capacitor insulating film formation film 24A on the film formation conditions equivalent to those of the lower electrode formation film 23A. The upper electrode formation film 25A consists of an oxide, a nitride or an oxynitride of a noble metal such as platinum or iridium. In the second embodiment, an underlying layer of the upper electrode formation film 25A is the second interlayer insulating film 19 on which the island.like lower electrodes 23B are formed.

Figure 9D:
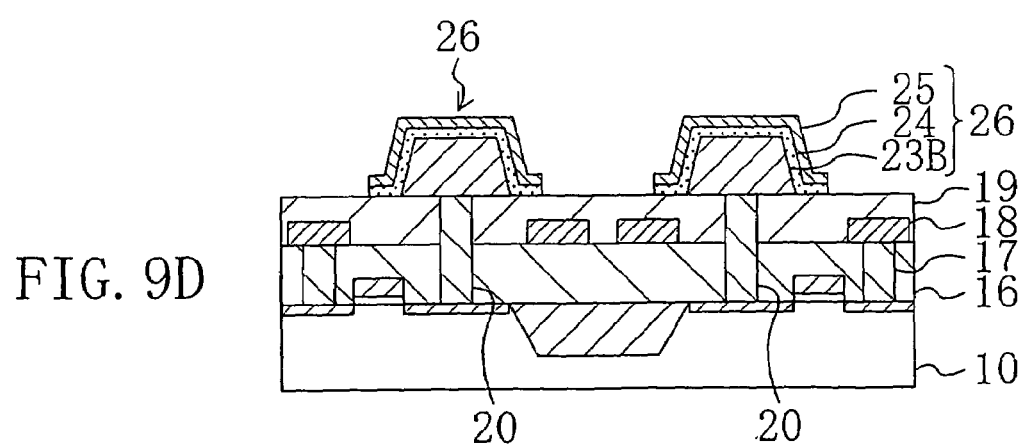

Next, as shown in FIG. 9D, the capacitor insulating film formation film 24A and the upper electrode formation film 25A are patterned by lithography and dry etching to cover the lower electrodes 23B. In this way, capacitor insulating films 24 are formed from the capacitor insulating film formation film 24A and upper electrodes 25 are formed from the upper electrode formation film 25A. As a result, capacitive elements 26 of a convex shape in cross section are formed which each consists of the lower electrode 23B, the capacitor insulating film 24 and the upper electrode 25.

Figure 10A:
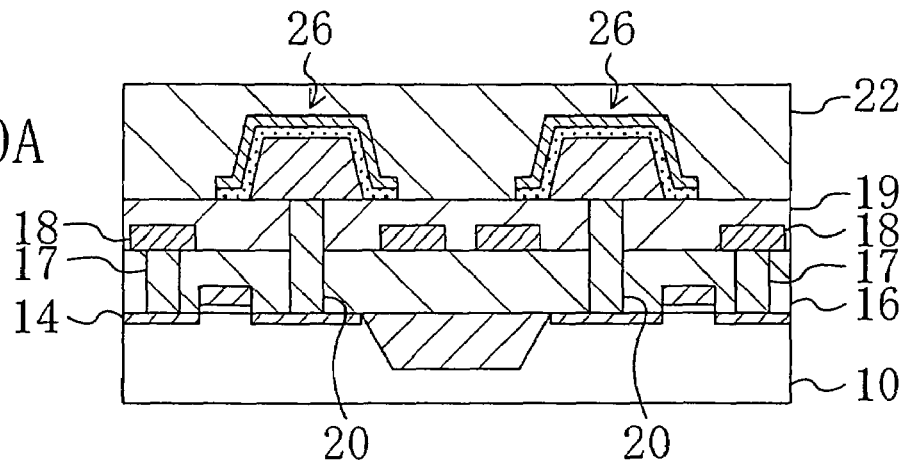
FIGS. 10A through 10C are structural cross-sectional views sequentially illustrating subsequent process steps of the method for fabricating a semiconductor device according to the second embodiment of the present invention.

Next, as shown in FIG. 10A, a third interlayer insulating film 22 of BPSG or the like is formed by CVD on the second interlayer insulating film 19 to cover the capacitive elements 26. Thereafter, the surface of the formed third interlayer insulating film 22 is planarized by CMP. A part of the planarized third interlayer insulating film 22 located over the upper end of each capacitive element 26 preferably has a thickness of 100 nm through 300 nm. Subsequently, heat treatment is performed on the capacitor insulating films 24 at a high temperature in an oxygen atmosphere to improve the quality of the capacitor insulating films 24, for example, to crystallize a ferroelectric material constituting the capacitor insulating films 24. This heat treatment may be annealing using a furnace or by Rapid Thermal Annealing (RTA). The heating temperature is preferably 500° C. through 800° C. both inclusive. Furthermore, the difference between the temperature at which heat treatment is performed on the capacitor insulating films 24 and the temperature at which the lower and upper electrodes 23B and 25 are formed preferably falls within 200° C. For example, if the heating temperature for improving the quality of the capacitor insulating films 24 is 700° C., the lower and upper electrodes 23B and 25 are preferably formed at a temperature of 500° C. or more.

The above heat treatment may be performed to improve the quality of the capacitor insulating films 24 before the formation of the third interlayer insulating film 22. However, as described in the first embodiment, the heat treatment for improving the quality of the capacitor insulating films 24 is preferably performed after the formation of the third interlayer insulating film 22.

Also in the second embodiment, after the formation of the upper electrode formation film 25A, another heat treatment is preferably performed thereon at approximately 600° C. for approximately 60 seconds. Moreover, a stress due to the shrinkage of the upper electrode 25 during heat treatment increases with the increasing area of the upper electrode formation film 25A. Therefore, the heat treatment is more preferably performed after the patterning of the upper electrode formation film 25A.

Figure 10B:
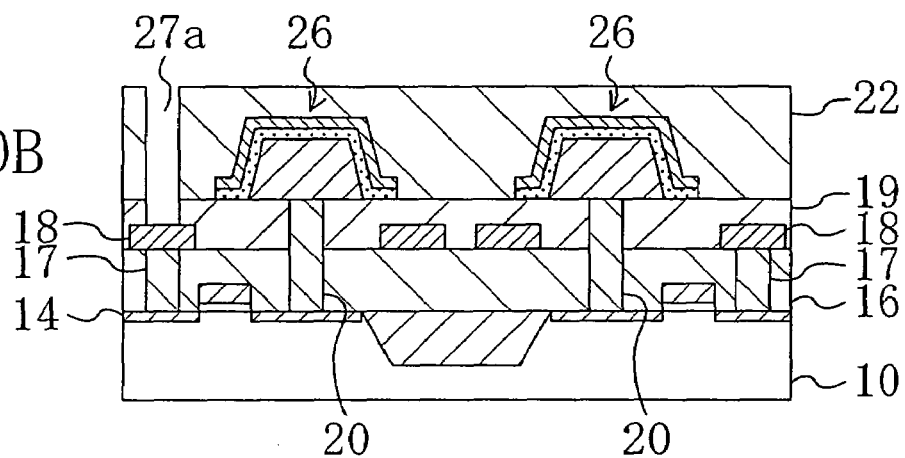

Next, as shown in FIG. 10B, a third contact hole 27a is formed by lithography and dry etching to expose the corresponding bit line 18 to the third interlayer insulating film 22 and the second interlayer insulating film 19.

Figure 10C:
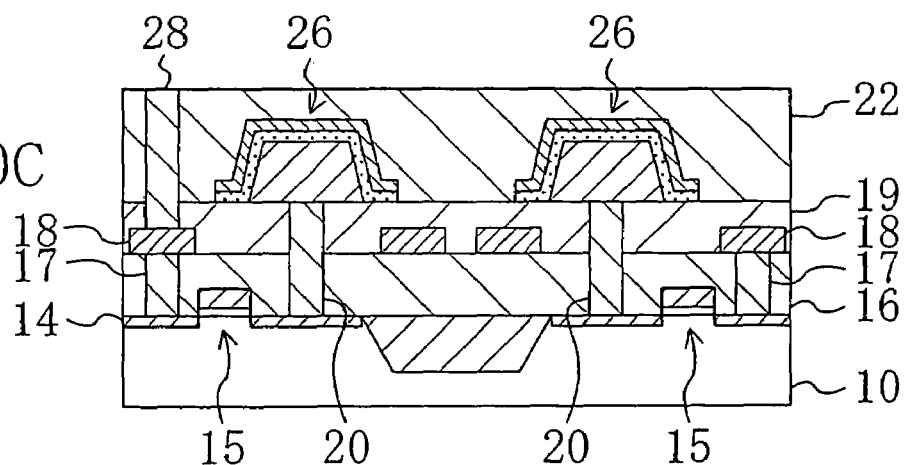

Next, as shown in FIG. 10C, a third contact plug formation film (not shown) is formed by sputtering, CVD or plating on the third interlayer insulating film 22 to fill in the third contact hole 27a. In this case, the material of the third contact plug formation film may be equivalent to that of the first contact plug 17. Furthermore, before the formation of the third contact plug formation film, an adhesion layer may be formed which consists of a layered film of titanium nitride and titanium or tantalum nitride and tantalum. Thereafter, the formed third contact plug formation film is subjected to an etch back or CMP process until the third interlayer insulating film 22 is exposed. A third contact plug 28 is thereby formed from the third contact plug formation film to allow electrical connection with the corresponding bit line 18. In this way, a so-called stacked contact is formed of the first contact plug 17, the bit line 18 and the third contact plug 28.

As described above, in the second embodiment, an oxide of a noble metal is used for each upper electrode 25 having bends and constituting a part of the capacitive element 26 of a convex shape in cross section. This can prevent the upper electrode 25 from being disconnected due to the volume shrinkage thereof and a leakage current from being produced in any one of the capacitor insulating films 24, during the heat treatment for the crystallization of the capacitor insulating films 24.

Modification of Embodiment 2

A modification of the second embodiment of the present invention will be described hereinafter with reference to the drawing.

Figure 11:
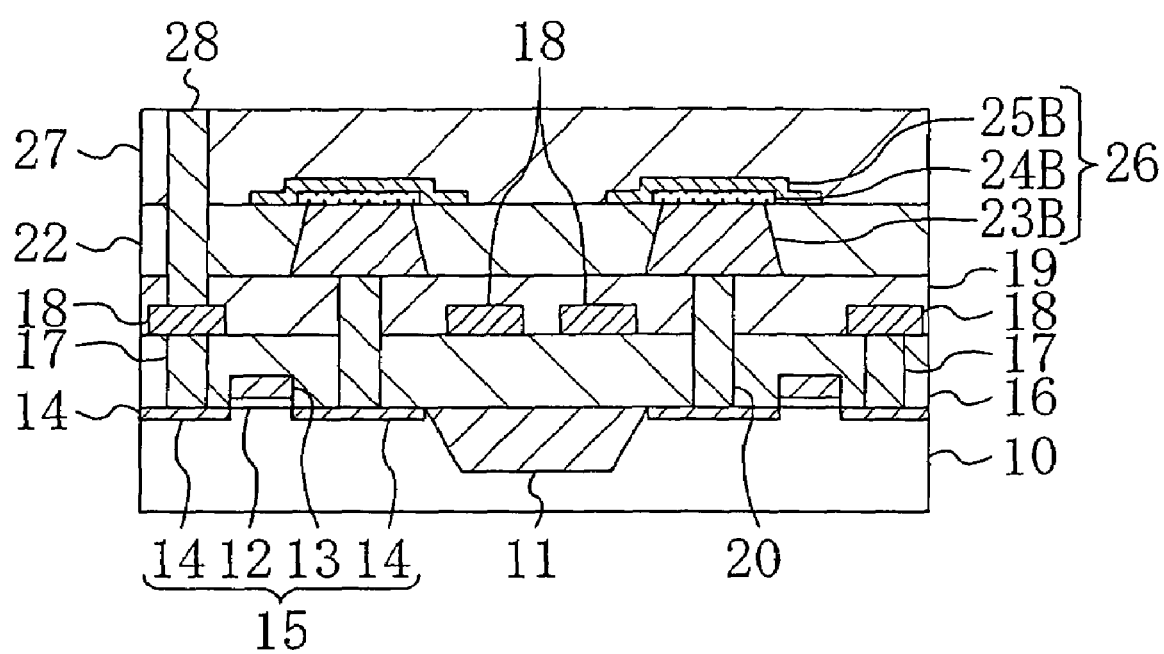
FIG. 11 shows a cross-sectional structure of a semiconductor device according to a modification of the second embodiment of the present invention.

FIG. 11 shows a cross.sectional structure of a semiconductor memory device according to a modification of the second embodiment of the present invention. In FIG. 11, the same numerals are given to the same components as those shown in FIG. 8. Thus, a description thereof is not given.

As shown in FIG. 11, in this modification, the side regions of lower electrodes 23B constituting a part of the capacitive element 26 and made of iridium oxide are surrounded by a third interlayer insulating film 22. A capacitor insulating film 24B and an upper electrode 25B are formed on each lower electrode 23B and the third interlayer insulating film 22 both having planarized top surfaces.

Therefore, in this modification, the underlying layers of the upper electrode formation film 25A are the third interlayer insulating film 22 and the capacitor insulating film 24B.

Also in this modification thus constructed, an oxide of a noble metal is used for each upper electrode 25B having bends and constituting a part of the capacitive element 26 of a convex shape in cross section. This can prevent the lower electrode 23B or the upper electrode 25B from being disconnected and a leakage current from being produced in any of the capacitor insulating films 24B, during the heat treatment for the crystallization of the capacitor insulating films 24B.

In the first and second embodiments and the modification of the second embodiment, the electrodes of the capacitive element 26 are given as an example of a conductive film that can avoid disconnection. However, the conductive film of the present invention is not limited to the electrodes of the capacitive element. For example, the present invention is extremely useful for such semiconductor processes that, for example, a conductive film is formed to be concave or convex in cross section, i.e., to have bends, and thereafter heat treatment is performed at a higher temperature than the temperature at which the conductive film is formed.

Furthermore, a transistor 15 does not necessarily have to be formed directly in the semiconductor substrate 10. For example, it may be formed in part of a semiconductor layer epitaxially grown on the substrate.

In order to prevent each capacitor insulating film 24 that is a ferroelectric film from being reduced in a hydrogen atmosphere, a hydrogen.permeable barrier film may be formed to cover the upper or lower part of the capacitive element or the capacitive element itself or even completely surround the capacitive element.

(Findings of the Present Inventors)

The present inventors repeatedly studied, through various experiments, causes of disconnection occurring when a conductive film having bends is subjected to heat treatment at a higher temperature than its formation temperature. As a result, the present inventors have obtained the following findings.

First, when a conductive film is formed of a noble metal, such as platinum (Pt), to have a concave or convex cross section, i.e., to have bends, it is likely to cause disconnection. The noble metal is commonly used because of its resistance to oxidation. The present inventors have determined that a cause of disconnection is that platinum has a low resistance to migration. Therefore, they have recognized that a platinum conductive film easily causes disconnection due to heat treatment at a higher temperature than the temperature at which it is formed.

Accordingly, the first finding is that the use of an oxide or a nitride of a noble metal as a material of a conductive film having bends prevents the conductive film from being disconnected due to heat treatment. An oxide or a nitride of a noble metal has a higher resistance to migration and a smaller volume shrinkage than the noble metal. This nature can prevent the conductive film from being disconnected during heat treatment on the other members such as a dielectric film. The reason for this is that noble metals are generally chemically stable and therefore can prevent atoms constituting a ferroelectric material from being diffused, for example, during heat treatment on the ferroelectric material. This can suppress a decrease in the polarization of the ferroelectric material. Therefore, the reliability of the ferroelectric material can be maintained to form a stable electrode.

Figure 12:
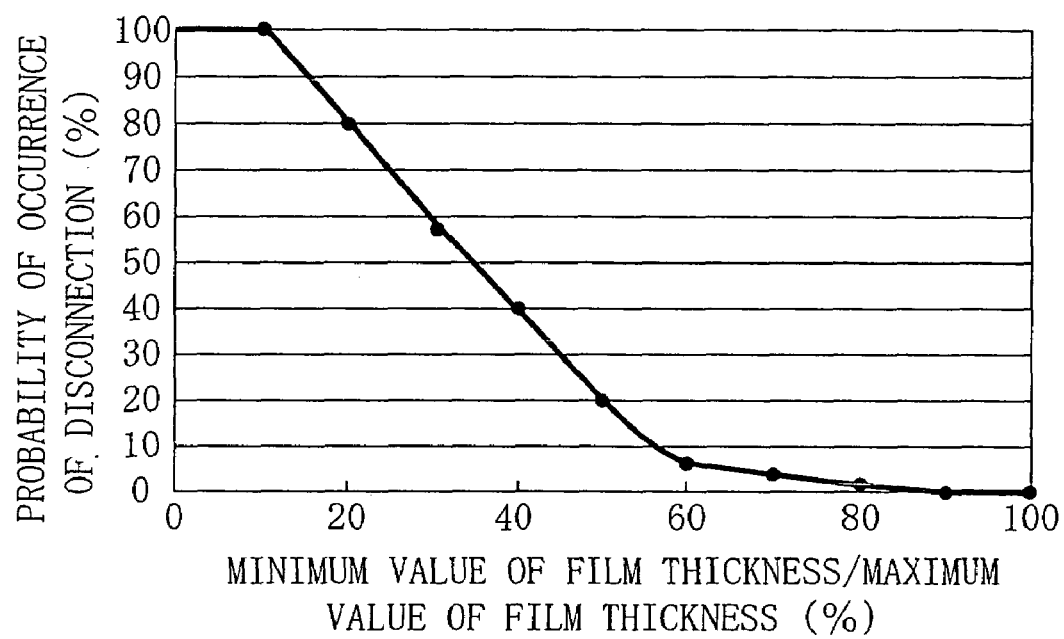
FIG. 12 is a graph illustrating the relationship between the film thickness ratio between the thinnest and thickest parts of a conductive film and the probability of occurrence of disconnection in the conductive film in the present invention.

The second finding is that if the film thickness ratio between the thinnest and thickest parts of a conductive film of an oxide, a nitride or an oxynitride of a noble metal is 0.8 or more, this prevents the conductive film having bends from being disconnected due to heat treatment. Also in this case, the composition of the conductive film is not restrictive. If the conductive film has a thin part and a thick part, this facilitates the movement of atoms (molecules) in the thin part to the thick part. As a result, the thin part may be broken. In particular, if the conductive film is formed along an underlying layer of an uneven shape, the formed conductive film tends to be thin in its steps, and its thickness significantly changes in its corners. Therefore, it is likely to cause disconnection in its corners. For example, when the film thickness ratio of a conductive film between its thinnest and thickest parts is 0.8 or more, its preferable materials include titanium nitride (TiN), iridium oxide ($IrO_x$), titanium aluminum nitride (TiAlN), and titanium aluminum oxynitride (TiAlON). FIG. 12 illustrates the relationship between the film thickness ratio between the thinnest and thickest parts of a conductive film of titanium nitride and the probability of occurrence of disconnection in the conductive film. As shown in FIG. 12, it is found that when the film thickness ratio between the thinnest and thickest parts of the conductive film is 0.8 or more, disconnection is not produced in the conductive film.

Figure 13:
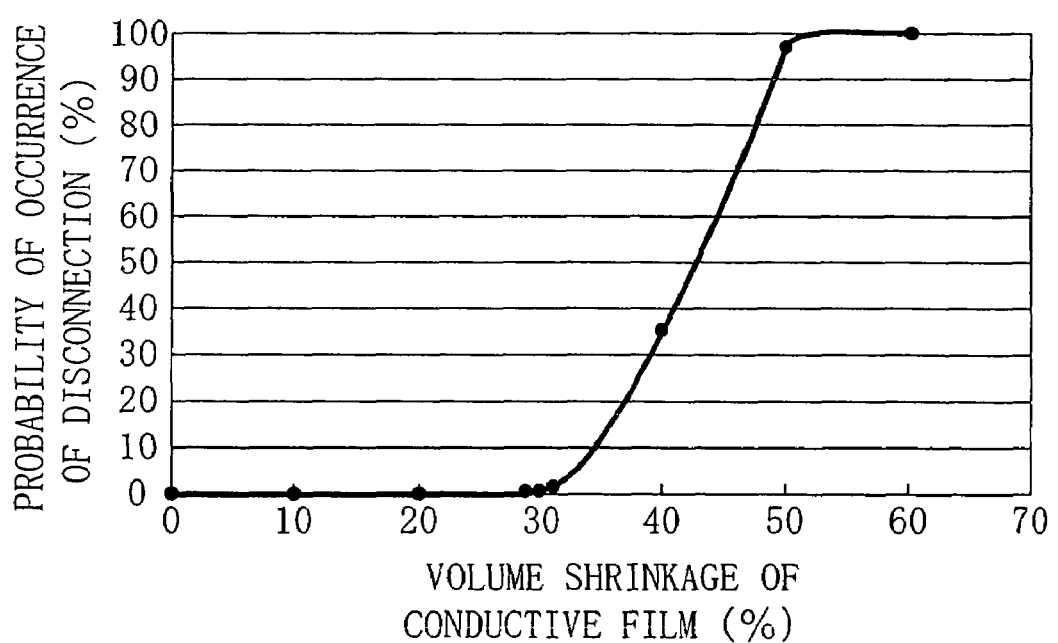
FIG. 13 is a graph illustrating the relationship between the volume shrinkage of a conductive film of platinum and the probability of occurrence of disconnection in the conductive film in the present invention.

The third finding is that when the volume shrinkage of a conductive film due to heat treatment during or after the formation of a dielectric film is set at 30% or less, disconnection due to the heat treatment is not produced in the conductive film having bends. The conductive film need only have conductivity, and materials therefor are not restrictive to metals, oxides or nitrides of the metals, or their mixtures. For example, materials for a conductive film whose volume shrinkage is 30% or less during heat treatment on a dielectric film include oxides of iridium (Ir). FIG. 13 illustrates the relationship between the volume shrinkage of a conductive film of platinum (Pt) and the probability of occurrence of disconnection in the conductive film both due to the heat treatment. As shown in FIG. 13, it is found that when the volume shrinkage of the conductive film exceeds 30%, disconnection is produced in the conductive film.

Figure 14:
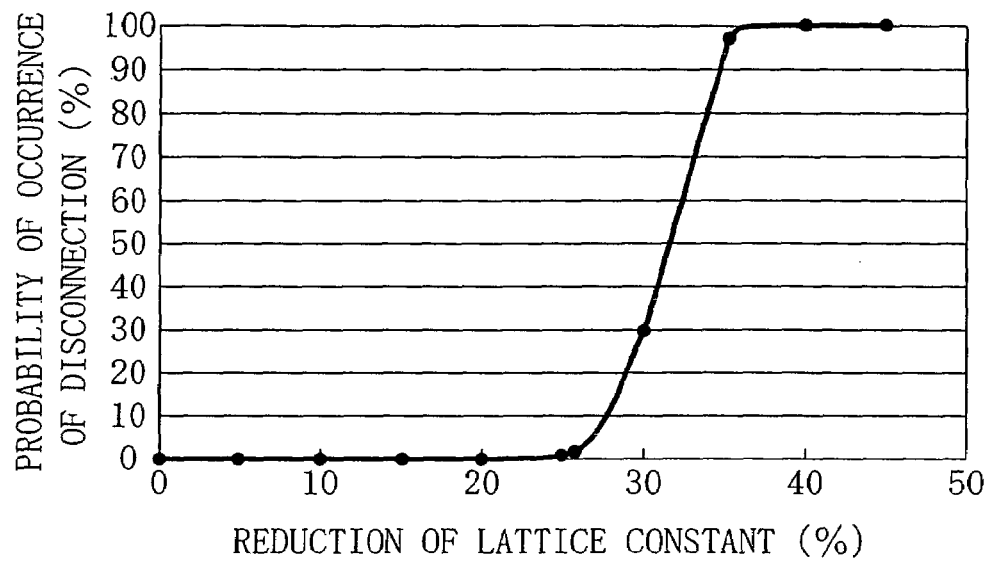
FIG. 14 is a graph illustrating the relationship between the reduction of the lattice constant of a conductive film of platinum and the probability of occurrence of disconnection in the conductive film in the present invention.

The fourth finding is that when the reduction of the lattice constant of a conductive film due to heat treatment during or after the formation of a dielectric film is set at 25% or less, disconnection due to the heat treatment is not produced in the conductive film having bends. Also in this case, the composition of the conductive film is not restrictive. For example, materials for a conductive film whose reduction of the lattice constant is 25% or less during heat treatment on a dielectric film include oxides of iridium (Ir). FIG. 14 illustrates the relationship between the reduction of the lattice constant of a conductive film of platinum (Pt) and the probability of occurrence of disconnection in the conductive film both due to heat treatment. As shown in FIG. 14, it is found that when the reduction of the lattice constant of platinum exceeds 25%, disconnection is produced in the conductive film.

Figure 15:
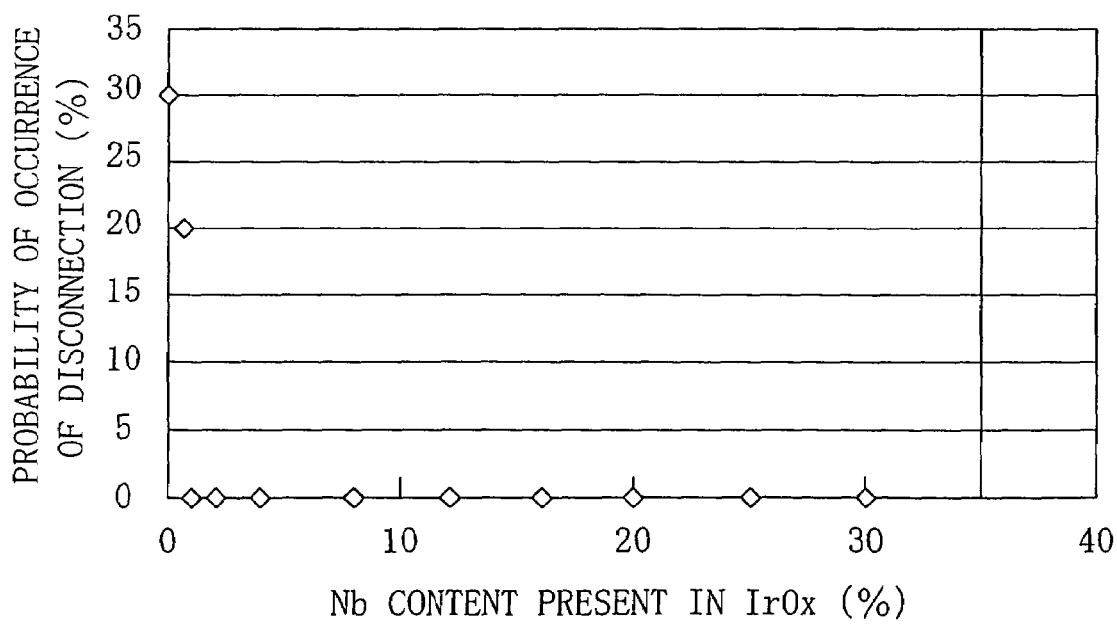
FIG. 15 is a graph illustrating the relationship between the content of the refractory metal and the probability of occurrence of disconnection in the present invention.

The fifth finding is that the addition of a refractory metal to a conductive film having bends prevents the conductive film from being disconnected due to heat treatment. The reason for this is that a conductive film containing a refractory metal has a smaller volume shrinkage than a conductive film containing no refractory metal. This nature can prevent the conductive film from being disconnected during heat treatment on a dielectric film. Also in this case, the composition of the conductive film is not restrictive. Furthermore, the refractory metal is preferably tungsten (W), tantalum (Ta), niobium (Nb), molybdenum (Mo), vanadium (V) or chrome (Cr). A metal used as the refractory metal is different from a noble metal used for the conductive film. FIG. 15 illustrates the relationship between the content of a refractory metal added in a conductive film and the probability of occurrence of disconnection in the conductive film. As shown in FIG. 15, when niobium is added to the conductive film of iridium oxide, the conductive film is hardly dissolved at a niobium content of 35 weight % or more. The content of niobium added to the conductive film is preferably 0.5 weight % through 30 weight %, and more preferably 5 weight % through 30 weight %.

Figure 16:
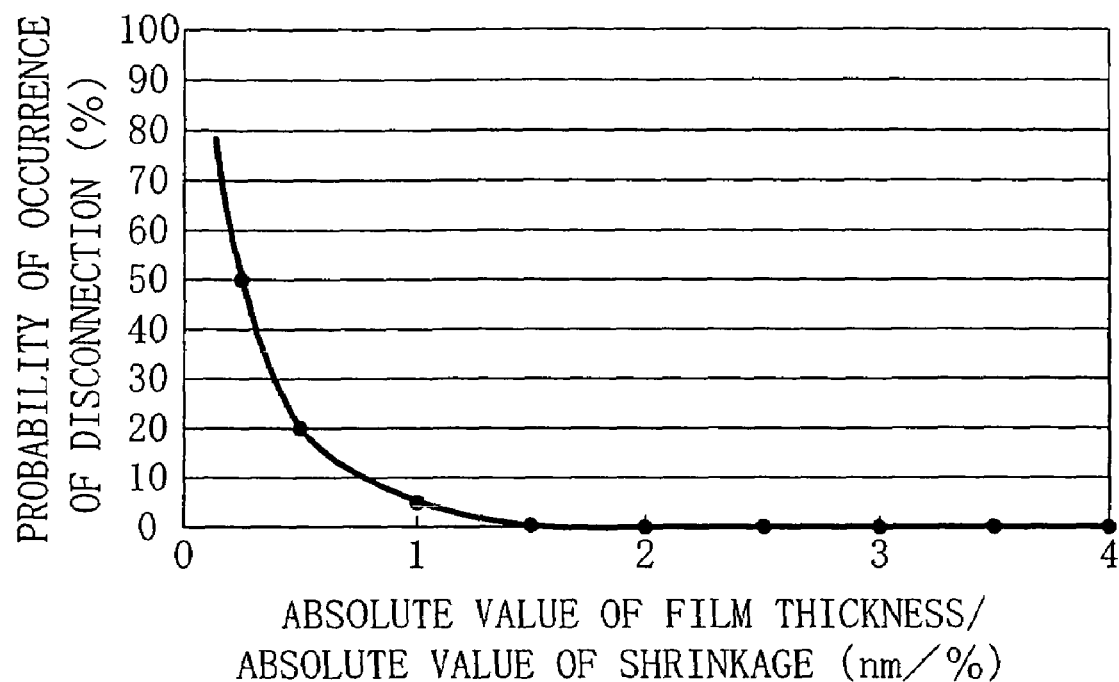
FIG. 16 is a graph illustrating the relationship between the ratio of the thickness (in nanometers) and the shrinkage (percentage) of a conductive film and the probability of occurrence of disconnection in the conductive film in the present invention.

The sixth finding is that when the ratio of the thickness (in nanometers) to the shrinkage (percentage) of a conductive film both due to heat treatment during or after the formation of a dielectric film is 1.5 or more, this prevents the conductive film having bends from being disconnected due to the heat treatment. FIG. 16 illustrates the relationship between the ratio of the absolute value of the thickness to the absolute value of the shrinkage (percentage) of a conductive film of platinum (Pt) and the probability of occurrence of disconnection in the conductive film. As shown in FIG. 16, it is found that when the ratio of the thickness (in nanometers) to the shrinkage (percentage) of the conductive film is 1.5 or more, this can prevent the conductive film from being disconnected. The maximum value of the thickness of the conductive film is large enough to form a capacitive element in the recess of the underlying layer. For example, if the conductive film is thick enough to fill in the recess, this will make it impossible to form a capacitive element.

The seventh finding is that when the size of grains constituting a conductive film of a polycrystal is set to one.third or less of the thickness of the conductive film, this prevents the conductive film having bends from being disconnected due to heat treatment. The present inventors' experiment has shown that a conductive film having bends, i.e., a concave or convex cross section is disconnected due to a small tolerance of a part of the conductive film in which grain boundaries are aligned in the film thickness direction to a tensile stress. Therefore, if the size of grains is set to one.third or less of the thickness of the conductive film, the number of grains along the film thickness direction will be relatively large. This easily reduces the stress to the conductive film, and therefore the conductive film having bends is hardly disconnected.

Figure 17:
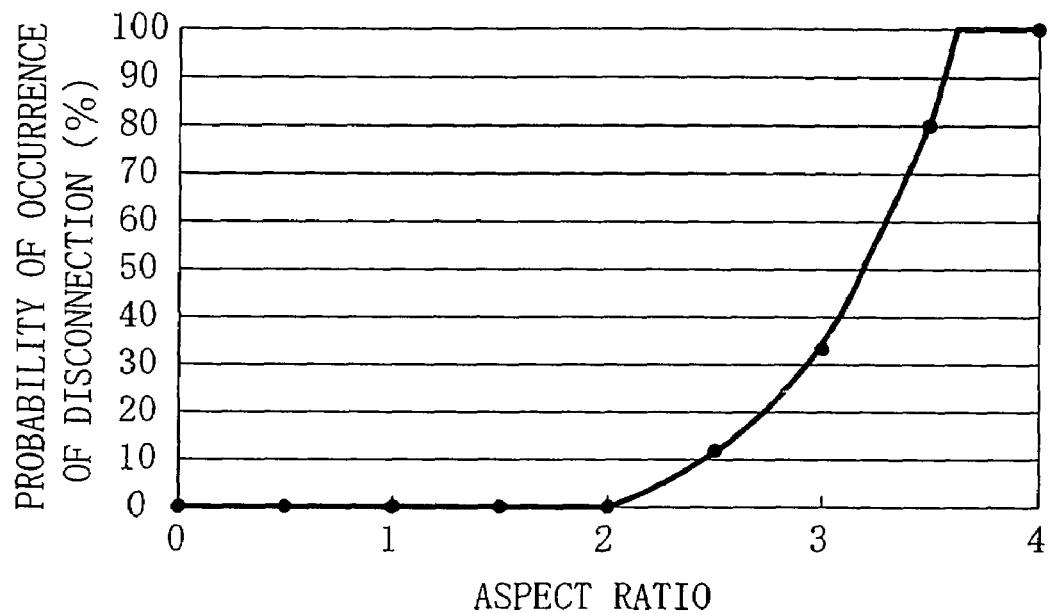
FIG. 17 is a graph illustrating the relationship between the aspect ratio and the probability of occurrence of disconnection in the present invention.

The eighth finding is that when the aspect ratio (depth/opening diameter) of a recess placed in an insulating film serving as an underlying layer of a capacitive element is 2 or less, this prevents a conductive film having bends from being disconnected due to heat treatment. FIG. 17 illustrates the relationship between the aspect ratio of a recess in an insulating film and the probability of occurrence of disconnection in a conductive film. As shown in FIG. 17, it is found that when the aspect ratio is set at 2 or less, this can prevent disconnection. When the aspect ratio is larger than 2, the coverage of the underlying layer of the conductive film over the recess is extremely deteriorated. Thus, disconnection easily occurs.

Figure 18:
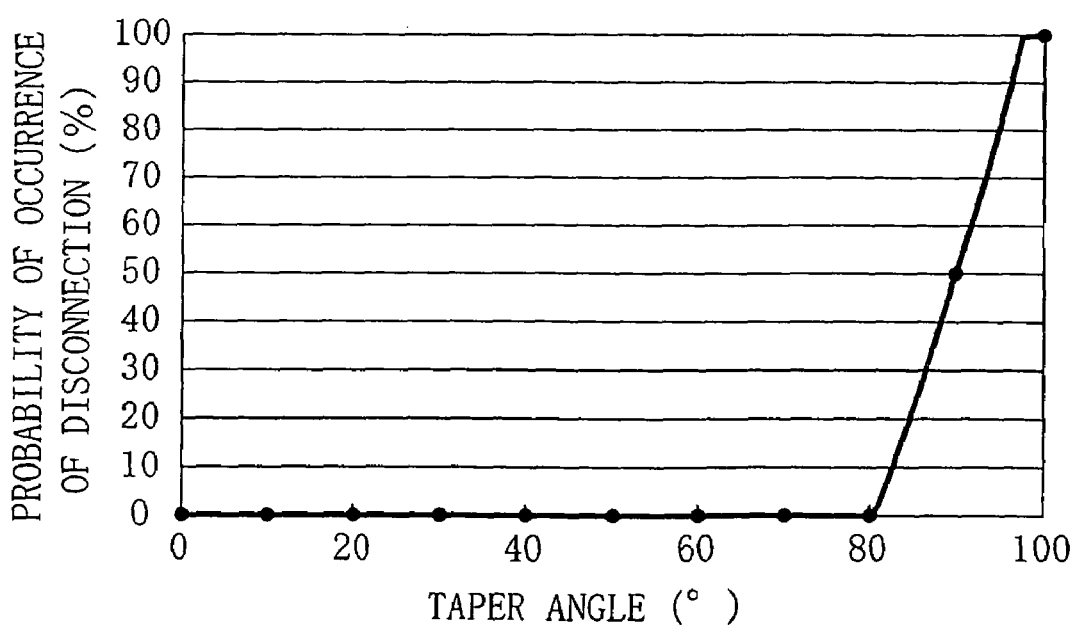
FIG. 18 is a graph illustrating the relationship between the taper angle of the wall surface of a recess or the side surface of a projection in an underlying layer and the probability of occurrence of disconnection in the present invention.

The ninth finding is that when the wall surface of a recess or the side surface of a projection of an underlying layer is formed to have an angle (taper angle) of 0 through 80 degrees both inclusive from the principal surface of the underlying layer, this prevents a conductive film having bends from being disconnected due to heat treatment. FIG. 18 illustrates the relationship between the taper angle and the probability of occurrence of disconnection in a conductive film. As shown in FIG. 18, when the taper angle is set at 80 degrees or less, the conductive film can be prevented from being disconnected. The reason for this is that the setting improves the coverage of the conductive film over the recess or projection of the underlying film.

The tenth finding is that when a conductive film having bends is formed on a dielectric film at a temperature of 300° C. through 600° C. both inclusive, this prevents the conductive film from being disconnected due to heat treatment. As in the first and second embodiments, when the conductive film is formed at a relatively high temperature of 300° C. or more for its formation temperature and heat treatment is then performed on the dielectric film at a higher temperature to improve the quality of the dielectric film, this reduces the heat shrinkage of the conductive film due to the heat treatment on the dielectric film. The reason for this is that the conductive film has already undergone a relatively high.temperature thermal history. Accordingly, the conductive film can be prevented from being disconnected. On the other hand, if the conductive film is formed at 600° C. or more, the coverage of the underlying layer over the recess or projection will be deteriorated or the other members such as contact plugs and bit lines will be oxidized. The reason for this is that the rate limiting in a film formation process is switched from supply basis to reaction basis.

The eleventh finding is that when the difference between the temperature at which heat treatment is performed on a dielectric film and the temperature during the formation of a conductive film having bends is set within 200° C., this prevents the conductive film from being disconnected due to the heat treatment. Also in this case, as in the first and second embodiments, when heat treatment is performed on the dielectric film at a higher temperature than the temperature during the conductive film formation to improve the quality of the dielectric film, this reduces the heat shrinkage of the conductive film due to the heat treatment on the dielectric film. The reason for this is that the conductive film has already undergone a thermal history within a difference of 200° C. from the temperature of the heat treatment. Accordingly, the conductive film can be prevented from being disconnected. Furthermore, the temperature of heat treatment on the dielectric film is not necessarily higher than the temperature during conductive film formation. Depending on the materials of the dielectric film and the conductive film, it may be lower than the temperature during conductive film formation.

The twelfth finding is that when heat treatment is performed on a conductive film at a temperature higher than the temperature during conductive film formation and lower than the temperature at which the dielectric is crystallized after the formation of the conductive film and before the heat treatment on the dielectric film, this prevents the conductive film having bends from being disconnected due to the heat treatment. Also in this case, as in the first and second embodiments, a thermal history is applied to the conductive film by the heat treatment at a temperature higher than the temperature during conductive film formation and lower than the temperature at which the dielectric is crystallized. In this way, the conductive film can be restrained from rapidly shrinking during the heat treatment on the dielectric. This can prevent the conductive film from being disconnected.

The thirteenth finding is that when heat treatment is performed on a dielectric film with a protective insulating film formed on a conductive film, this prevents the conductive film having bends from being disconnected due to the heat treatment. Also in this case, as in the first and second embodiments, when the heat treatment is performed on the dielectric film with the conductive film (upper electrode) covered with the protective insulating film (interlayer insulating film), this can improve the surface morphology of the conductive film and can suppress the shrinkage of the conductive film. This can prevent the conductive film from being disconnected.

The fourteenth finding is that when an adhesion layer is provided between an underlying layer having recesses or projections at its top surface and a conductive film to enhance the adhesion of the conductive film to the underlying layer, this prevents the conductive film having bends from being disconnected due to heat treatment. Thus, migration hardly occurs in the conductive film (lower electrode) during the heat treatment on the dielectric for improving its quality. This can prevent the conductive film from being disconnected.

The fifteenth finding is that when an adhesion layer is formed on an upper electrode using a gas containing no hydrogen atom to enhance the adhesion to the upper electrode, this prevents the upper electrode having bends from being disconnected due to heat treatment. The reason for this is that if an adhesion layer is formed using a gas containing hydrogen atoms, the hydrogen atoms deteriorate a dielectric film. When the dielectric film consists of a ferroelectric material, the polarization of the dielectric film is reduced. Therefore, it is desirable that the adhesion layer is formed without containing hydrogen atoms.

Specific examples of the conductive films in the above findings as described above include the upper and lower electrodes according to the first and second embodiments and the modification of the second embodiment.

Embodiment 3

A third embodiment of the present invention will be described hereinafter with reference to the drawings. In the third embodiment, a description will be given of the structure of a semiconductor memory device based on the above-mentioned fourteenth finding of the present invention.

Figure 19:
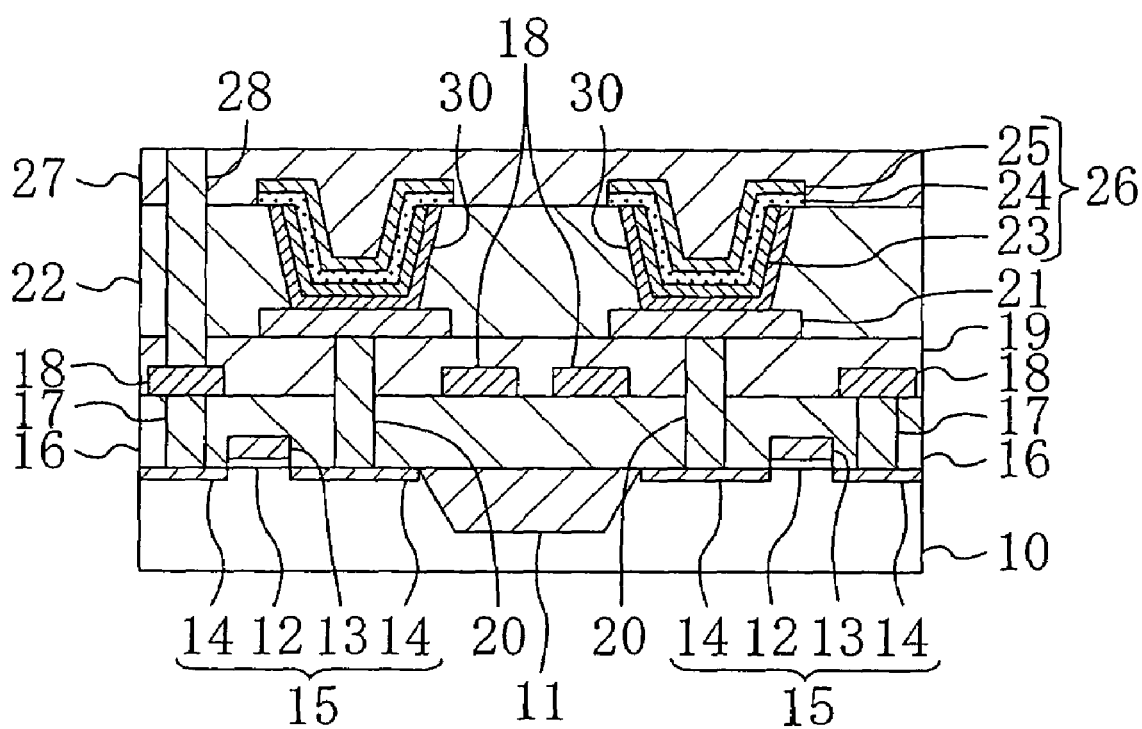
FIG. 19 shows a cross-sectional structure of a semiconductor device according to a third embodiment of the present invention.

FIG. 19 shows a cross.sectional structure of a semiconductor memory device according to the third embodiment of the present invention. In FIG. 19, the same numerals are given to the same components as those shown in FIG. 1. Thus, a description thereof is not given.

As shown in FIG. 19, approximately 10-nm-thick adhesion layers 30 are formed between a third interlayer insulating film 22 and the lower electrodes 23, respectively.

When each adhesion layer 30 is oxidized by heat treatment for improving the quality of a capacitor insulating film 24, it causes thermal expansion and increases its contact resistance. Therefore, a hard-to-oxidize material is preferably employed therefor. In particular, the use of a metal oxide, a metal nitride or a metal oxynitride enhances the adhesion and can certainly prevent the adhesion layer 30 from being oxidized.

In this case, preferable examples of materials for the adhesion layer 30 include tantalum (Ta), titanium aluminum nitride (TiAlN), titanium aluminum (TiAl), titanium aluminum oxynitride (TiAlON), iridium oxide ($IrO_2$), ruthenium oxide ($RuO_2$), tungsten nitride (WN), tantalum nitride (TaN), titanium nitride (TiN), aluminum silicon nitride (AlSiN), and tantalum silicon nitride (TaSiN).

An oxide of a noble metal such as iridium oxide ($IrO_2$) as in the first embodiment does not necessarily have to be used for the lower and upper electrodes 23 and 25 both constituting the capacitive element 26 of the third embodiment. A noble metal alone such as platinum or iridium conventionally used may be used as the main ingredient of these electrodes 23 and 25.

As described above, the semiconductor device and the method for fabricating the same of the present invention prevents the conductive film from being disconnected during the heat treatment on the dielectric film after the formation of the conductive film. The present invention is useful, in particular, for semiconductor devices having a capacitive film of a ferroelectric material, which is placed to contact a conductive film of a concave or convex cross section, and methods for fabricating the same.

What is claimed is:

1. A semiconductor device comprising a capacitive element including a first conductive film formed on the bottom and wall surfaces of an opening formed in an insulating film on a substrate, a dielectric film formed on the first conductive film, and a second conductive film formed on the dielectric film, wherein the dielectric film of the capacitive element is crystallized, and at least the first conductive film is made of a polycrystal of an oxide or an oxynitride of a noble metal.

2. The semiconductor device of claim 1, wherein the second conductive film is made of a polycrystal of an oxide or an oxynitride of a noble metal.

* * * * *